(12) United States Patent
Yang et al.

(10) Patent No.: US 12,082,407 B2
(45) Date of Patent: Sep. 3, 2024

(54) THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Yuancheng Yang, Wuhan (CN); Wenxi Zhou, Wuhan (CN); Zhiliang Xia, Wuhan (CN); Wei Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 409 days.

(21) Appl. No.: 17/483,176

(22) Filed: Sep. 23, 2021

(65) Prior Publication Data

US 2023/0005940 A1    Jan. 5, 2023

Related U.S. Application Data

(63) Continuation of application No. PCT/CN2021/103413, filed on Jun. 30, 2021.

(51) Int. Cl.
*H10B 41/40* (2023.01)
*H01L 23/00* (2006.01)
(Continued)

(52) U.S. Cl.
CPC .......... *H10B 41/40* (2023.02); *H01L 23/481* (2013.01); *H01L 24/80* (2013.01);
(Continued)

(58) Field of Classification Search
CPC ........ H10B 41/40; H10B 41/27; H10B 41/35; H10B 43/27; H10B 43/35; H10B 43/40;
(Continued)

(56) References Cited

U.S. PATENT DOCUMENTS

2011/0118989 A1    5/2011  Morinaga
2016/0343450 A1   11/2016  Lee et al.
(Continued)

FOREIGN PATENT DOCUMENTS

CN    110140213 A       8/2019
CN    112614853 A  *   12/2020
(Continued)

OTHER PUBLICATIONS

International Search Report issued in corresponding International Application No. PCT/CN2021/103427, mailed Mar. 28, 2022, 4 pages.
(Continued)

*Primary Examiner* — Mohammad A Rahman
(74) *Attorney, Agent, or Firm* — BAYES PLLC

(57) ABSTRACT

A three-dimensional (3D) memory device includes a first substrate, a first semiconductor structure, and a second semiconductor structure. The first semiconductor structure is disposed on the first substrate. The first semiconductor structure includes a second substrate, and a peripheral device disposed over the second substrate, and the peripheral device is formed facing the first substrate. The second semiconductor structure is disposed on the first semiconductor structure. The second semiconductor structure includes a doped semiconductor layer, and a memory array structure disposed between the doped semiconductor layer and the first semiconductor structure.

19 Claims, 20 Drawing Sheets

(51) Int. Cl.
　　*H01L 23/48* 　　(2006.01)
　　*H01L 25/00* 　　(2006.01)
　　*H01L 25/065* 　(2023.01)
　　*H10B 41/27* 　　(2023.01)
　　*H10B 41/35* 　　(2023.01)
　　*H10B 43/27* 　　(2023.01)
　　*H10B 43/35* 　　(2023.01)
　　*H10B 43/40* 　　(2023.01)
(52) U.S. Cl.
　　CPC .......... *H01L 25/0657* (2013.01); *H01L 25/50* (2013.01); *H10B 41/27* (2023.02); *H10B 41/35* (2023.02); *H10B 43/27* (2023.02); *H10B 43/35* (2023.02); *H10B 43/40* (2023.02); *H01L 2224/80001* (2013.01)
(58) Field of Classification Search
　　CPC ....... H10B 43/50; H01L 23/481; H01L 24/80; H01L 25/0657; H01L 25/50; H01L 2224/80001; H01L 24/20; H01L 27/0688; H01L 21/76898; H01L 24/83
　　See application file for complete search history.

(56) References Cited

U.S. PATENT DOCUMENTS

| | | |
|---|---|---|
| 2017/0084696 A1 | 3/2017 | Lee et al. |
| 2019/0088589 A1* | 3/2019 | Zhu ................ H10B 43/40 |
| 2021/0005629 A1 | 1/2021 | Lim et al. |

FOREIGN PATENT DOCUMENTS

| | | |
|---|---|---|
| CN | 112909007 A | 6/2021 |
| WO | 2019182657 A1 | 9/2019 |

OTHER PUBLICATIONS

International Search Report issued in corresponding International Application No. PCT/CN2021/103413, mailed Mar. 28, 2022, 4 pages.

* cited by examiner

THREE-DIMENSIONAL MEMORY DEVICE AND METHOD FOR FORMING THE SAME

CROSS-REFERENCE TO RELATED APPLICATIONS

This application is a continuation of International Application No. PCT/CN2021/103413, filed on Jun. 30, 2021, entitled "THREE-DIMENSIONAL MEMORY DEVICE AND METHOD FOR FORMING THE SAME," which is hereby incorporated by reference in its entirety. This application is also related U.S. application Ser. No. 17/483,121, filed on Sep. 23, 2021, entitled "THREE-DIMENSIONAL MEMORY DEVICE AND METHOD FOR FORMING THE SAME," which is hereby incorporated by reference in its entirety.

BACKGROUND

The present disclosure relates to memory devices and methods for forming memory devices, and more particularly, to three-dimensional (3D) memory devices and methods for forming 3D memory devices.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A 3D semiconductor device architecture can address the density limitation in some planar semiconductor devices, for example, Flash memory devices.

A 3D semiconductor device can be formed by stacking semiconductor wafers or dies and interconnecting them vertically so that the resulting structure acts as a single device to achieve performance improvements at reduced power and a smaller footprint than conventional planar processes. Among the various techniques for stacking semiconductor substrates, bonding, such as hybrid bonding, is recognized as one of the promising techniques because of its capability of forming high-density interconnects.

SUMMARY

In one aspect, a 3D memory device is disclosed. The 3D memory device includes a first substrate, a first semiconductor structure, and a second semiconductor structure. The first semiconductor structure is disposed on the first substrate. The first semiconductor structure includes a second substrate, and a peripheral device disposed over the second substrate, and the peripheral device is formed facing the first substrate. The second semiconductor structure is disposed on the first semiconductor structure. The second semiconductor structure includes a doped semiconductor layer, and a memory array structure disposed between the doped semiconductor layer and the first semiconductor structure.

In another aspect, a system is disclosed. The system includes a 3D memory device configured to store data and a memory controller. The 3D memory device includes a first substrate, a first semiconductor structure, and a second semiconductor structure. The first semiconductor structure is disposed on the first substrate. The first semiconductor structure includes a second substrate, and a peripheral device disposed over the second substrate, and the peripheral device is formed facing the first substrate. The second semiconductor structure is disposed on the first semiconductor structure. The second semiconductor structure includes a doped semiconductor layer, and a memory array structure disposed between the doped semiconductor layer and the first semiconductor structure. The memory controller is coupled to the 3D memory device and is configured to control operations of the 3D memory device.

In still another aspect, a method for forming a 3D memory device is disclosed. A memory array structure is formed. A first substrate is formed over the memory array structure. A peripheral device is formed in contact with the first substrate. A first interconnection layer is formed in a first dielectric layer over the peripheral device. A second substrate is formed over the first dielectric layer. A doped semiconductor layer is formed in contact with the memory array structure.

In yet another aspect, a method for forming a 3D memory device is disclosed. A first dielectric layer is formed on a first substrate. A memory array structure is formed in the first dielectric layer. A second substrate is bonded to the first dielectric layer, the second substrate includes a second dielectric layer, and the second dielectric layer is bonded to the first dielectric layer. A heterogeneous interface is formed in the second substrate. A portion of the second substrate is removed along the heterogeneous interface to form a third substrate over the memory array structure. A peripheral device is formed in contact with the third substrate. A first interconnection layer is formed over the peripheral device and the third substrate. The first substrate is removed to expose the memory array structure. A doped semiconductor layer is formed in contact with the memory array structure.

In yet another aspect, a method for forming a 3D memory device is disclosed. A first dielectric layer is formed on a first substrate. A memory array structure is formed in the first dielectric layer. A composite substrate is bonded to the first dielectric layer, the composite substrate includes a second dielectric layer, and the second dielectric layer is bonded to the first dielectric layer. A portion of the composite substrate is removed to form a second substrate over the memory array structure. A peripheral device is formed in contact with the second substrate. A first interconnection layer is formed over the peripheral device and the second substrate. The first substrate is removed to expose the memory array structure. A doped semiconductor layer is formed in contact with the memory array structure.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
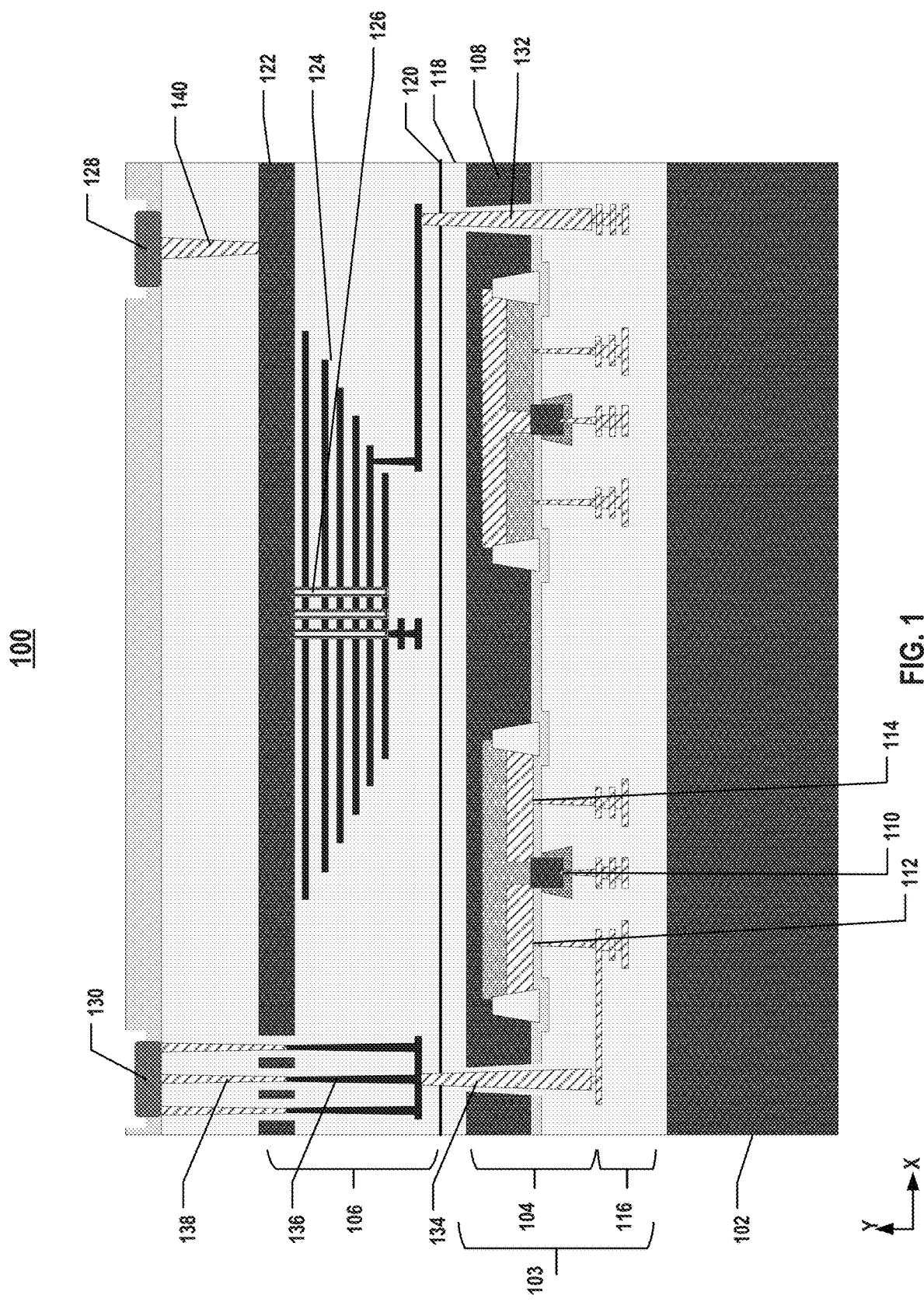
FIG. 1 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a stack of devices includes memory array devices and peripheral devices, such as complementary metal-oxide-semiconductor (CMOS) chips. As the number of layers in the array memory devices continues to increase, the sizes of either the memory array devices or the peripheral devices continue to decrease. Hence, the area of the CMOS chips needs to be reduced to ensure that the array efficiency will not be significantly reduced.

FIG. 1 illustrates a cross-section of an exemplary 3D memory device 100, according to some aspects of the present disclosure. 3D memory device 100 includes a substrate 102, a first semiconductor structure 103, a second semiconductor structure 106, and a contact pad 128. Substrate 102 may be a doped semiconductor layer and may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 102 may be silicon or glass handle wafer, or other suitable materials that can hold die, components, transistors, or other devices. In some implementations, 3D memory device 100 may be part of a non-monolithic 3D memory device, in which components (e.g., the peripheral device and memory array device) may be formed separately on different substrates and then bonded.

First semiconductor structure 103 is disposed on substrate 102. First semiconductor structure 103 includes a substrate 108, and a peripheral device layer 104 formed in substrate 108. First semiconductor structure 103 may further include a dielectric layer 118, e.g., silicon oxide, formed on peripheral device layer 104. Substrate 108 may be a doped single crystalline silicon layer. In some implementations, peripheral device layer 104 may include one or more peripheral devices formed in substrate 108 and are configured to control and sense 3D memory device 100. The peripheral devices may include any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors).

Peripheral device layer 104 may include transistors formed in substrate 108, in which the entirety or part of the transistors are formed in substrate 108, e.g., entirely below or partially below the top surface of substrate 108. It is understood that the spatially relative term "below" is used here to describe the transistors formed in substrate 108 or partially in substrate 108, and first semiconductor structure 103 may be flipped over in FIG. 1. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some implementations. It is understood that in some implementations, peripheral device layer 104 may further include any other circuits compatible with the advanced logic processes including logic circuits, such as processors and programmable logic devices (PLDs), or memory circuits, such as static random-access memory (SRAM) and dynamic RAM (DRAM).

In some implementations, first semiconductor structure 103 of 3D memory device 100 further includes an interconnection layer 116 between peripheral device layer 104 and substrate 102 to transfer electrical signals to and from peripheral device layer 104. Interconnection layer 116 may include a plurality of interconnects (also referred to herein as contacts), including lateral interconnect lines and vertical interconnect access (VIA) contacts. As used herein, the term interconnects can broadly include any suitable types of interconnects, such as middle-end-of-line (MEOL) interconnects and back-end-of-line (BEOL) interconnects. The interconnect layer can further include one or more interlayer dielectric (ILD) layers (a.k.a. intermetal dielectric (IMD) layers) in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

Second semiconductor structure 106 is disposed on first semiconductor structure 103. Second semiconductor structure may include a substrate 122, e.g., a doped polysilicon layer, and a memory array structure. In some implementations, 3D memory device 100 is a NAND Flash memory device in which memory cells are provided in the form of an array of NAND memory strings each extending vertically. As shown in FIG. 1, the memory array structure may include a memory stack 124 and channel structures 126. Memory stack 124 includes interleaved conductive layers and dielectric layers, and the conductive layers may include at least one source select gate line, a plurality of word lines, and at least one drain select gate line.

Channel structures 126 extend vertically through memory stack 124 in the y-direction. Channel structure 126 may include a channel hole filled with semiconductor materials (e.g., as a semiconductor channel) and dielectric materials (e.g., as a memory film). In some implementations, semiconductor channel includes silicon, such as amorphous silicon, polysilicon, or single crystalline silicon. In some implementations, the memory film is a composite layer including a tunneling layer, a storage layer (also known as a "charge trap layer"), and a blocking layer. In some implementations, the remaining space of channel structure may be partially or fully filled with a filling layer including dielectric materials, such as silicon oxide. Channel structure 126 may have a cylinder shape (e.g., a pillar shape). The filling layer, semiconductor channel, tunneling layer, storage layer, and blocking layer are arranged radially from the center toward the outer surface of the pillar in this order, according to some implementations. The tunneling layer may include silicon oxide, silicon oxynitride, or any combination thereof. The storage layer may include silicon nitride, silicon oxynitride, silicon, or any combination thereof. The blocking layer may include silicon oxide, silicon oxynitride, high dielectric constant (high-k) dielectrics, or any combination thereof. In one example, the memory film may include a composite layer of silicon oxide/silicon oxynitride (or silicon nitride)/silicon oxide (ONO).

Substrate 122 may be a doped semiconductor layer and may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 122 includes doped polysilicon layer. In some implementations, substrate 122 may electrically connect multiple channel structures 126. For example, the doped semiconductor layer (substrate 122) may provide electrical connections between the sources of an array of NAND memory strings in the same block, i.e., the array common source (ACS).

A bonding interface 120 is formed on the bonding surface between first semiconductor structure 103 and second semiconductor structure 106. In some implementations, bonding interface 120 is formed between dielectric layer 118, e.g., silicon oxide, of first semiconductor structure 103, and the dielectric layer, e.g., silicon oxide, of second semiconductor structure 106. First contact pad 128 is disposed on second semiconductor structure 106 and is electrically coupled to the doped polysilicon layer (substrate 122) of second semiconductor structure 106.

In some implementations, a through silicon contact (TSC) structure 132 and a TSC structure 134 are formed between first semiconductor structure 103 and second semiconductor structure 106. As shown in FIG. 1, at least one of the conductive layers (word lines) of memory stack 124 is electrically coupled to TSC structure 132. In some implementations, peripheral device layer 104 includes a transistor having a first source/drain terminal 112, a second source/drain terminal 114, and a gate terminal 110. First source/drain terminal 112 may be electrically connected to a contact pad 130 through interconnection layer 116, TSC structure 134, a through array contact (TAC) 136, and a VIA structure 138.

FIGS. 2-16 illustrate cross-sections of 3D memory device 100 at different stages of a manufacturing process, according to some aspects of the present disclosure. FIG. 17 illustrates a flowchart of an exemplary method 200 for forming 3D memory device 100, according to some aspects of the present disclosure. For the purpose of better describing the present disclosure, the cross-sections of 3D memory device 100 in FIGS. 2-16 and method 200 in FIG. 17 will be discussed together. It is understood that the operations shown in method 200 are not exhaustive and that other operations may be performed as well before, after, or between any of the illustrated operations. Further, some of the operations may be performed simultaneously, or in a different order than shown in FIGS. 2-16 and FIG. 17.

Figure 2:
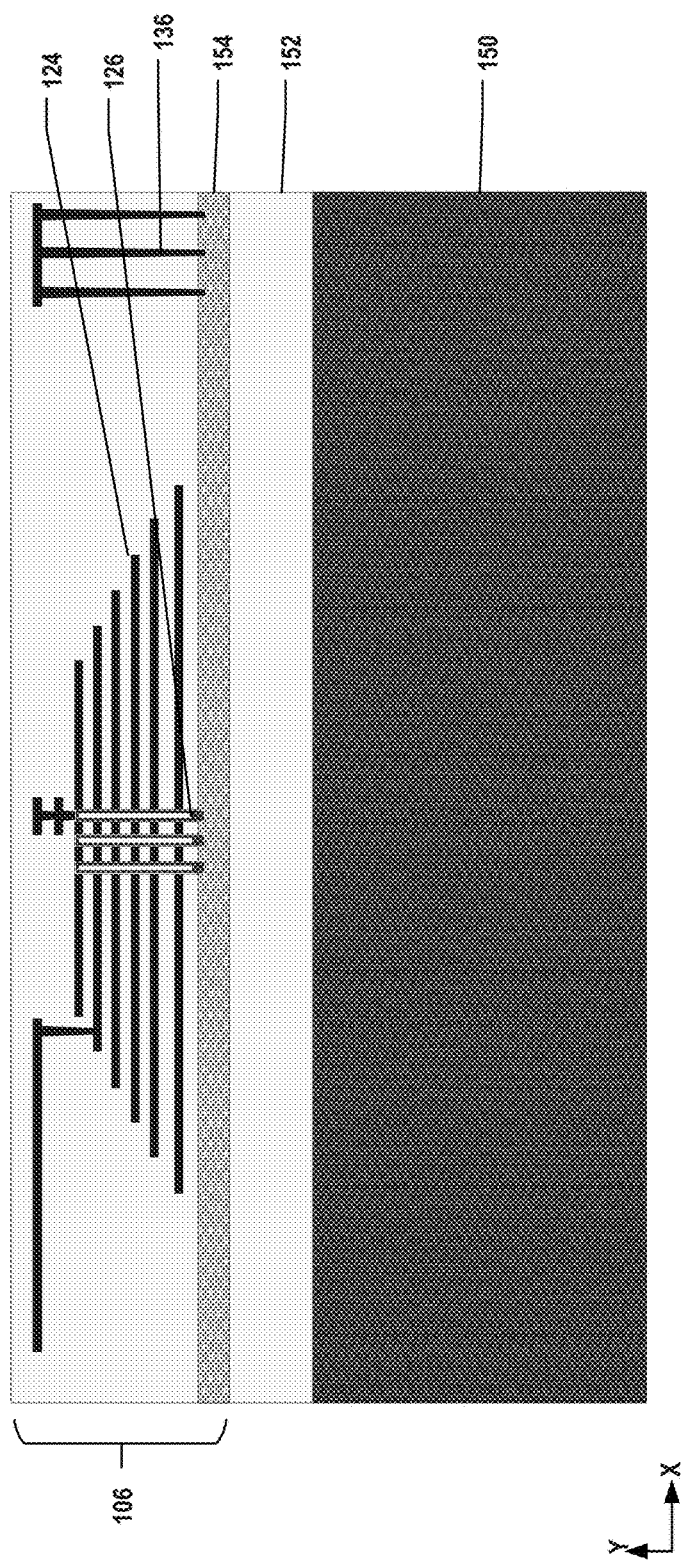
FIGS. 2-16 illustrate cross-sections of an exemplary 3D memory device at different stages of a manufacturing process, according to some aspects of the present disclosure.

As shown in FIG. 2 and operation 202 of FIG. 17, the memory array structure is formed on a substrate. The substrate includes a carrier substrate 150, a first stop layer 152 formed on carrier substrate 150, and a second stop layer 154 formed on first stop layer 152. Second stop layer 154 may act as an etch stop layer when etching the memory films of channel structures from the backside and thus, may include any suitable materials other than silicon oxide used in memory films, such as polysilicon or silicon nitride. First stop layer 152 can act as an etch stop layer when etching the channel holes from the front side and thus, may include any suitable materials that have a high etching selectivity (e.g., greater than about 5) with respect to the material directly on first stop layer 152), such as silicon oxide or polysilicon. It is understood that more stop layers may also be formed on carrier substrate 150. For example, an etch stop layer may be also formed on carrier substrate 150 that acts as an etch stop layer when removing carrier substrate 150 from the backside.

For forming memory array structure (second semiconductor structure 106) on carrier substrate 150, in some implementations, a dielectric stack including a plurality of dielectric layers and a plurality of sacrificial layers interleaved on second stop layer 154 is formed extending in the x-direction. Channel structure 126 is formed extending vertically through the dielectric stack in contact with second stop layer 154. Then, the plurality of sacrificial layers may be replaced with a plurality of conductive layers to form the word lines. In some implementations, each dielectric layer may include a layer of silicon oxide, and each sacrificial layer may include a layer of silicon nitride. The dielectric stack may be formed by one or more thin film deposition processes including, but not limited to, chemical vapor deposition (CVD), physical vapor deposition (PVD), atomic layer deposition (ALD), or any combination thereof. In some implementations, a pad oxide layer (not shown) is formed between second stop layer 154 and the dielectric stack by depositing dielectric materials, such as silicon oxide, on second stop layer 154.

Channel structure 126 is formed extending vertically through the dielectric stack in the y-direction. In some implementations, an etch process may be performed to form a channel hole in the dielectric stack that extends vertically through the interleaved dielectric/sacrificial layers. In some implementations, fabrication processes for forming the channel hole may include wet etching and/or dry etching, such as deep reactive ion etching (DRIE). In some implementations, the channel hole may extend further into the top portion of second stop layer 154. The etch process through the dielectric stack may be stopped at the top surface of first stop layer 152. Then, the memory film, including tunneling layer, storage layer, and blocking layer, and the semiconductor channel can be formed on the channel contact. In some implementations, channel structure 126 may not include the channel contact.

In some further implementations, for forming second semiconductor structure 106 on second stop layer 154, a stack structure including a plurality of word lines is formed on substrate 108. Then, channel structure 126 is formed extending vertically through the stack structure in contact with second stop layer 154.

Figure 3:
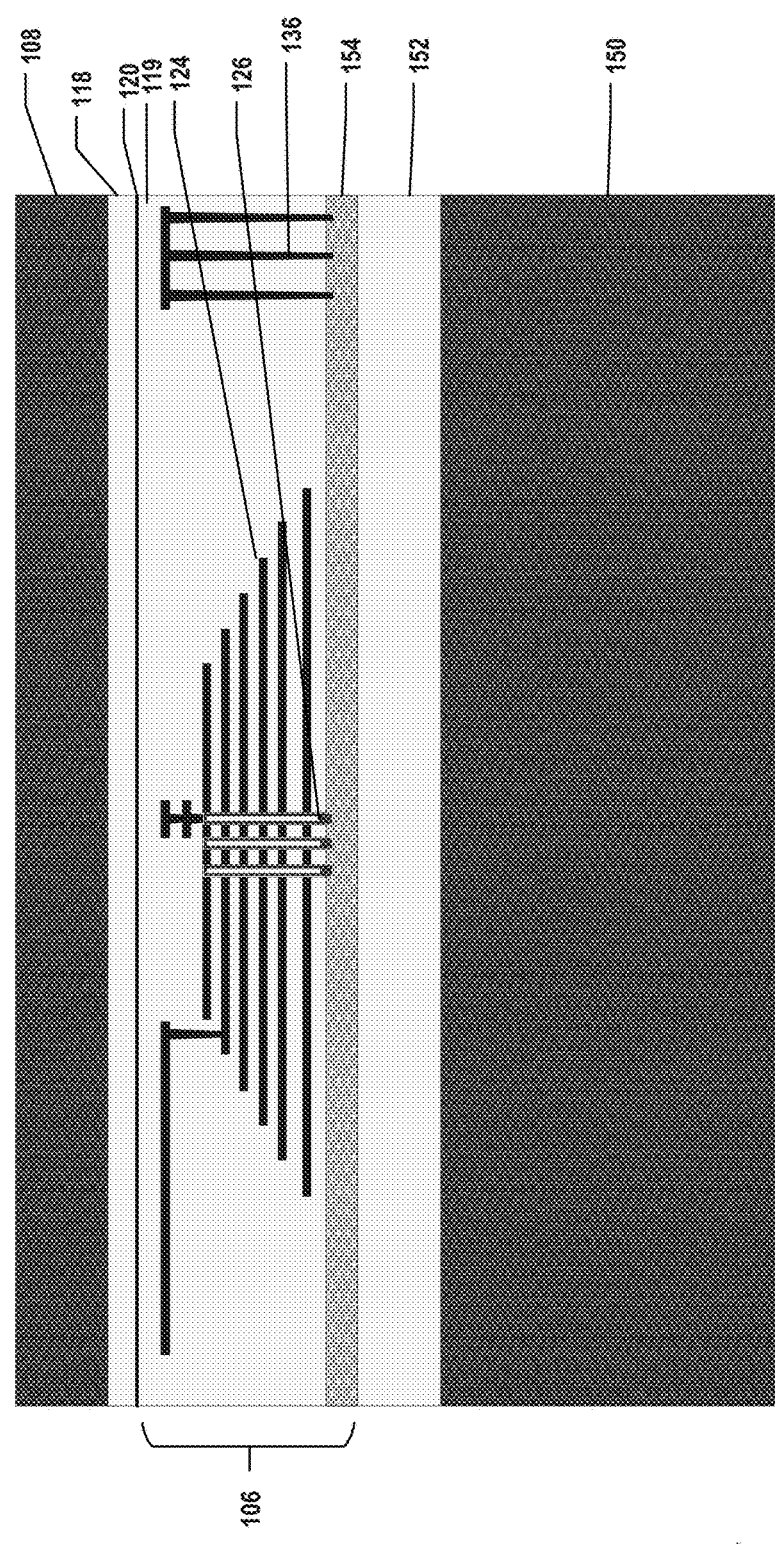

As shown in FIG. 3 and operation 204 of FIG. 17, a doped semiconductor layer, e.g., substrate 108, is formed over second semiconductor structure 106. The doped semiconductor layer includes single crystalline silicon. Second semiconductor structure 106 includes a dielectric layer 119 formed on the memory array structure, and dielectric layer 119 is bonded to dielectric layer 118. Bonding interface 120 is formed on the bonding surface between dielectric layer 119 and dielectric layer 118, as shown in FIG. 3.

Figure 18:
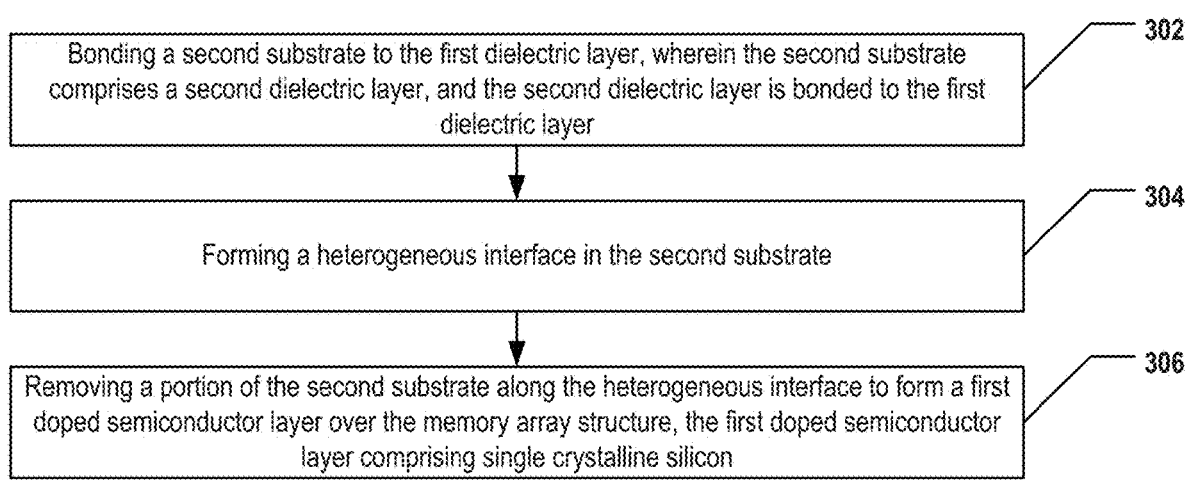
FIG. 18 illustrates a flowchart of another exemplary method for forming a 3D memory device, according to some aspects of the present disclosure.

In some implementations, bonding substrate 108 on second semiconductor structure 106 may include a series of operations shown in FIGS. 4-7. In FIGS. 4-7, a single crystalline silicon layer (substrate 108) is transferred from a substrate 156 (a "donor substrate") onto second semiconductor structure 106, for example, using a de-bonding process. FIG. 18 is a flowchart of an exemplary method 300 for transferring a single crystalline silicon layer, according to some aspects of the present disclosure.

Figure 4:
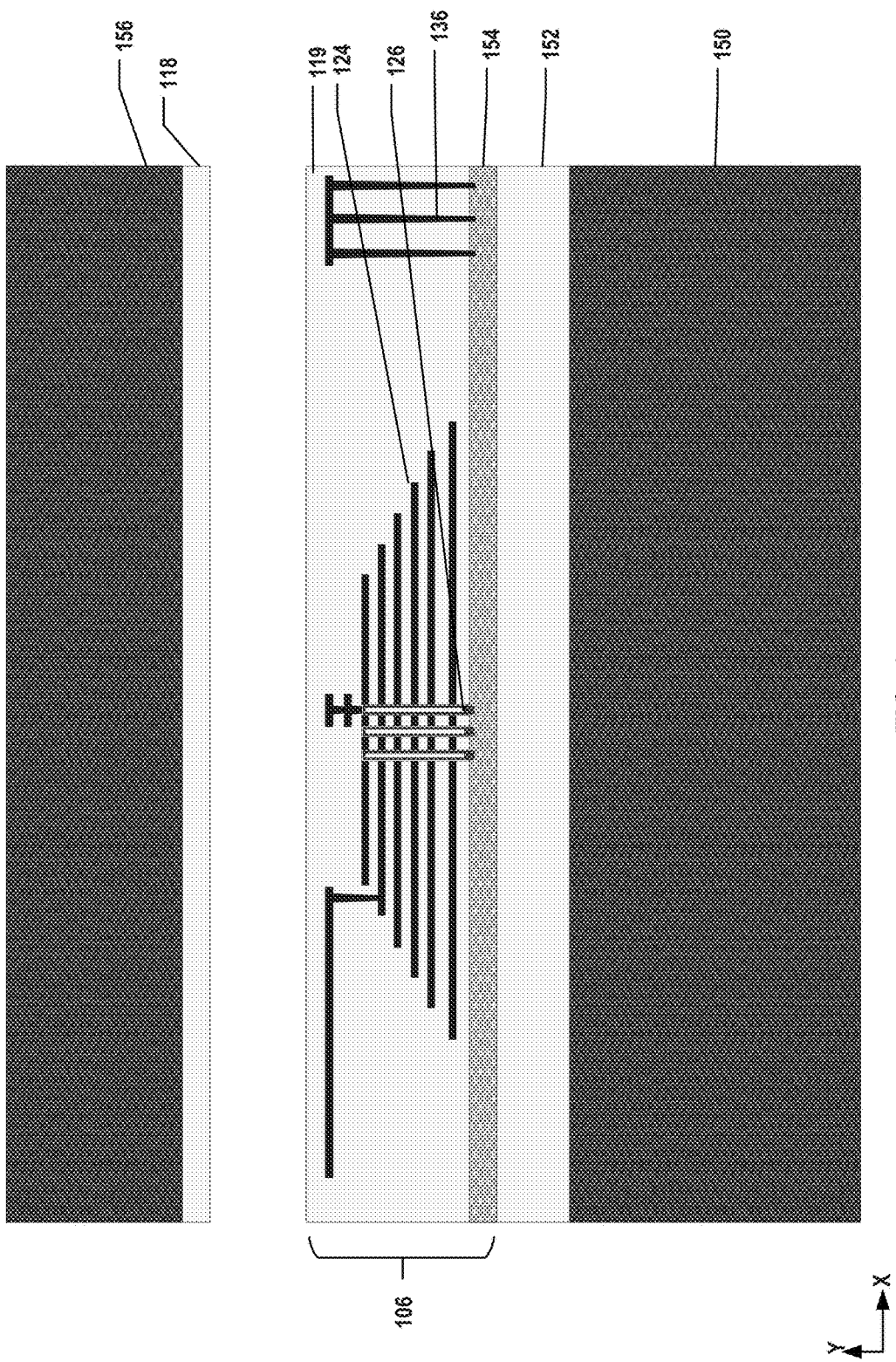
Figure 5:
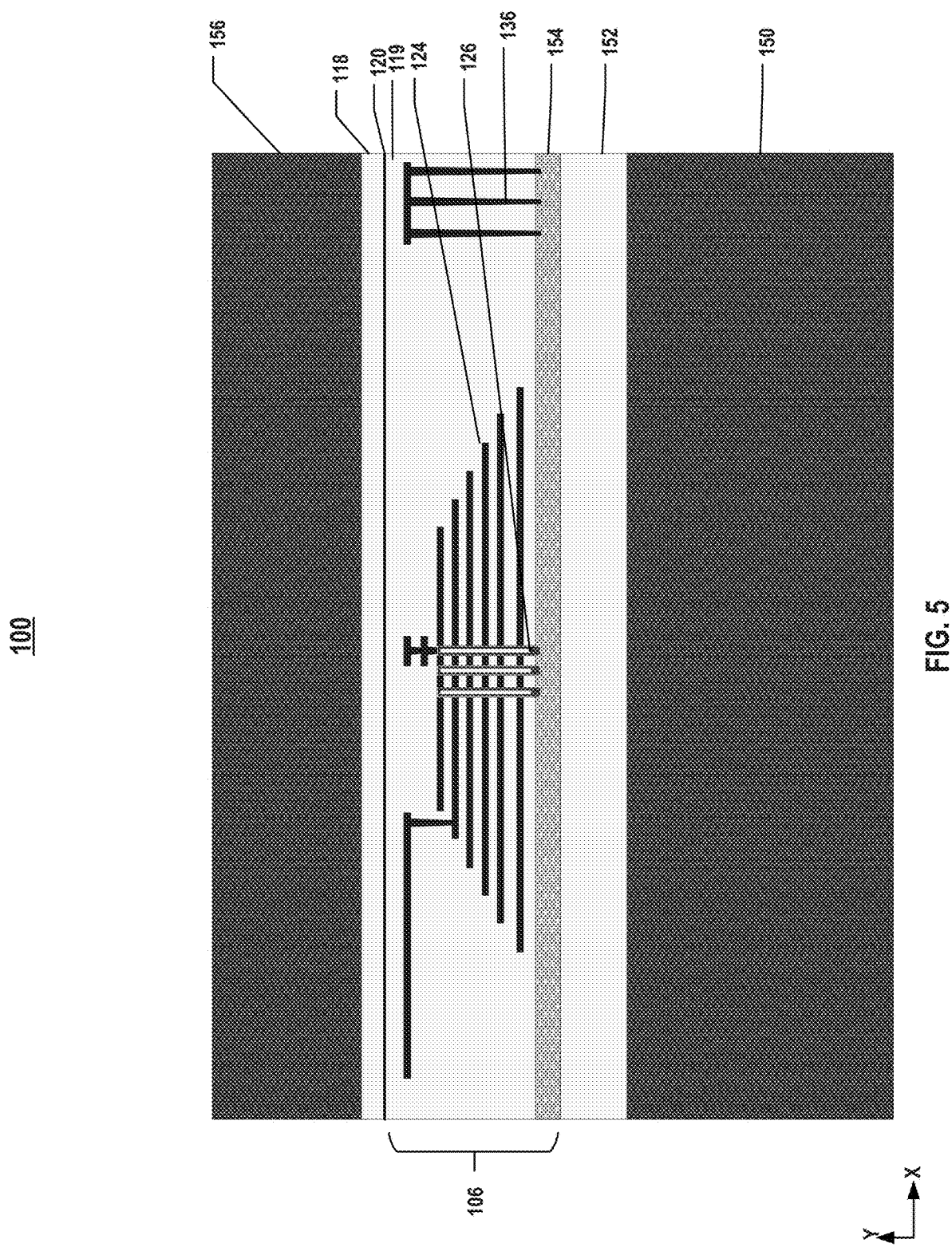

As shown in FIG. 4 and operation 302 in FIG. 18, substrate 156 including dielectric layer 118 is provided, and then substrate 156 is bonded onto second semiconductor structure 106, as shown in FIG. 5. Substrate 156 includes a single crystalline silicon layer. Bonding interface 120 is formed on the bonding surface between dielectric layer 118 and dielectric layer 119.

Figure 6:
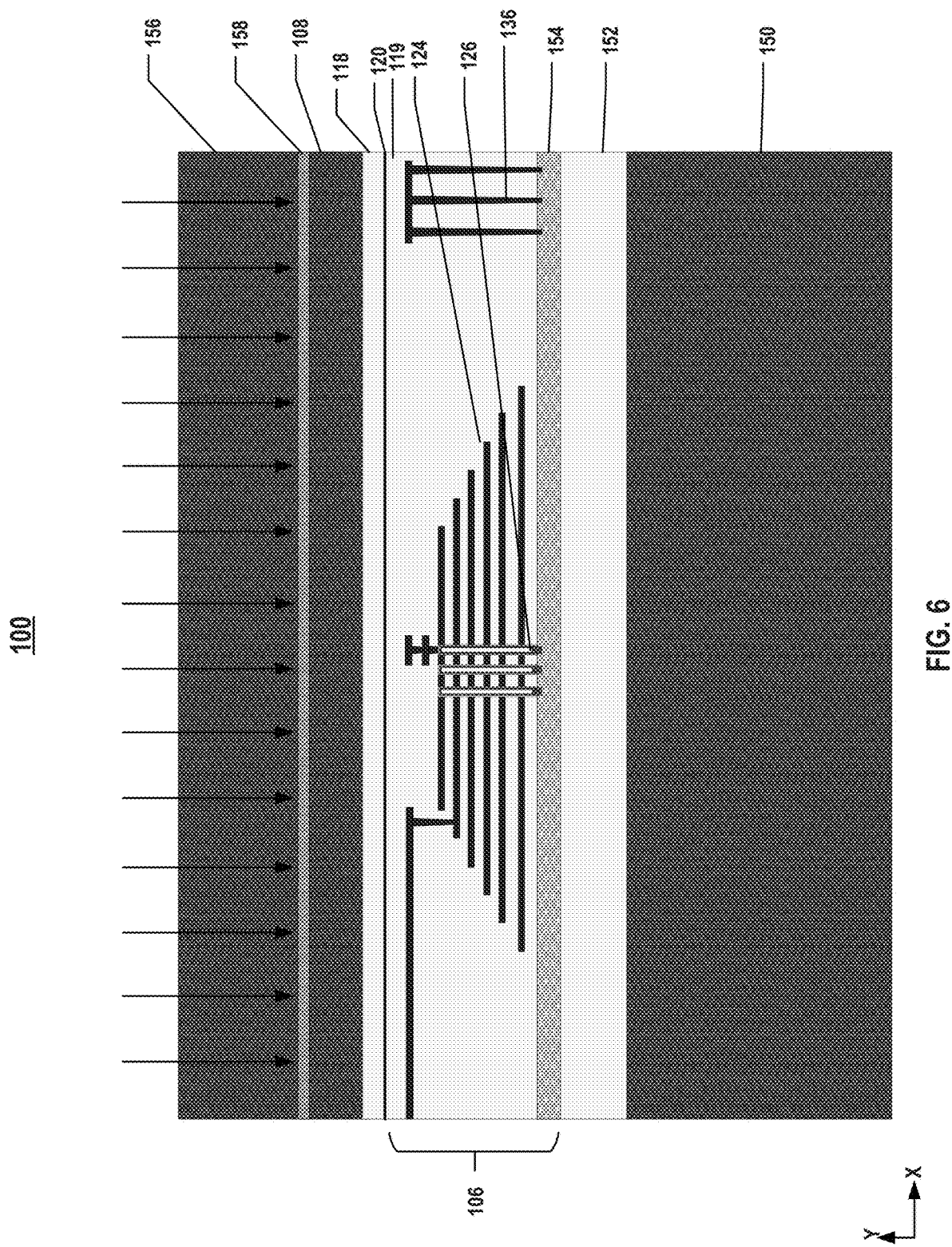

As shown in FIG. 6 and operation 304 in FIG. 18, a heterogeneous interface 158 is formed in substrate 156. In some implementations, an ion implantation process is performed into substrate 156 to form heterogeneous interface 158 in substrate 156, which separates a doped single crystalline silicon layer (substrate 108) from the remainder of substrate 156. In some embodiments, the dopant is hydrogen, including hydrogen ions and/or hydrogen atoms. It is understood that any other suitable dopants that can form heterogeneous interface 158 in substrate 156 may be used as well. For example, light-ion implantation may be used to implant light ions, such as protons or helium ions, into substrate 156, which can be later removed from substrate 156. The thickness of substrate 108, i.e., the distance between heterogeneous interface 158 and bonding interface 120 in the y-direction can be controlled by various parameters of the ion implantation, such as energy, dopant, dose, time, etc., as well as parameters of post-annealing, such as temperature and time of thermal diffusion following the ion implantation. In some embodiments, the thickness of substrate 108 is between about 1 μm and about 100 μm, such as between 1 μm and 100 μm (e.g., 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, any range bounded by the lower end by any of these values, or any range defined by any two of these values). Thickness uniformity can be controlled by fine-tuning control of the implanted dopants over the entire surface of substrate 156.

Heterogeneous interface 158 is an interface in substrate 156 between two layers with different materials, such as hydrogen-implanted single crystalline silicon and undoped single crystalline silicon as shown in FIG. 6. The existence of heterogeneous interface 158 in substrate 156 can facilitate the separation of the two material layers, such as substrate 108 and the remainder of substrate 156, later in the de-bonding process.

Figure 7:
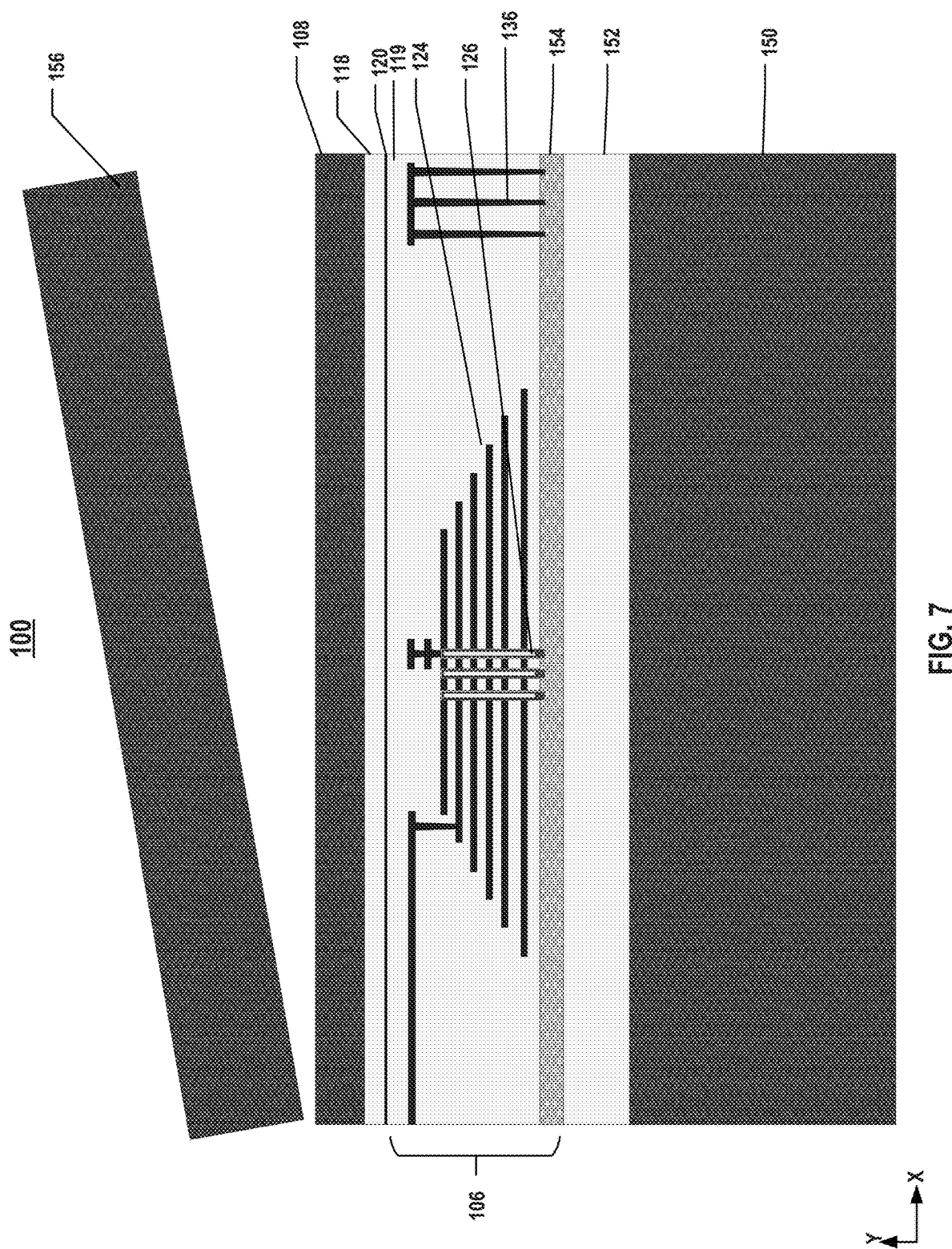

As shown in FIG. 7 and operation 306 in FIG. 18, the remainder of substrate 156 is removed from substrate 108 along heterogeneous interface 158. Substrate 108 is then formed over second semiconductor structure 106, and substrate 108 is doped single crystalline silicon, as shown in FIG. 3. The remainder of substrate 156 is split from substrate 108 along heterogeneous interface 158 in substrate 156 to leave substrate 108. Substrate 108 remains bonded on second semiconductor structure 106.

As illustrated in FIG. 7, substrate 156 is split from substrate 108 along heterogeneous interface 158 by applying a mechanical force on substrate 156, for example, because the bonding strength at bonding interface 120 is greater than the breaking force at heterogeneous interface 158. In other words, substrate 156 can be broken and peeled off from substrate 108 along heterogeneous interface 158. As a result, substrate 108 can be transferred from its donor substrate, substrate 156, to second semiconductor structure 106 using the de-bonding process described above. In some implementations, after splitting substrate 156 from substrate 108, a planarization operation, e.g., chemical mechanical polishing (CMP) process, may be further performed on the surface of substrate 108 to smooth the surface of substrate 108.

Figure 8:
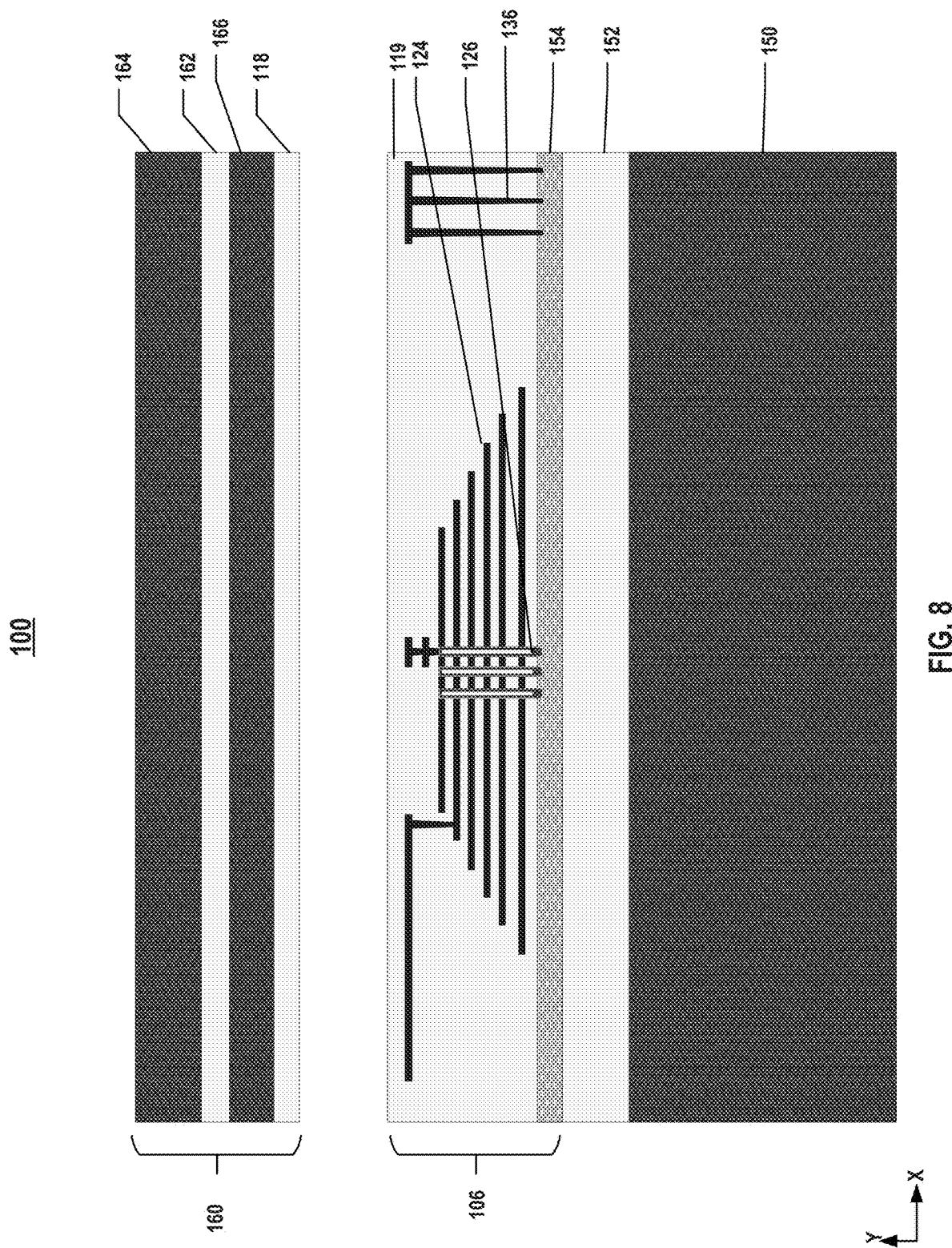
Figure 9:
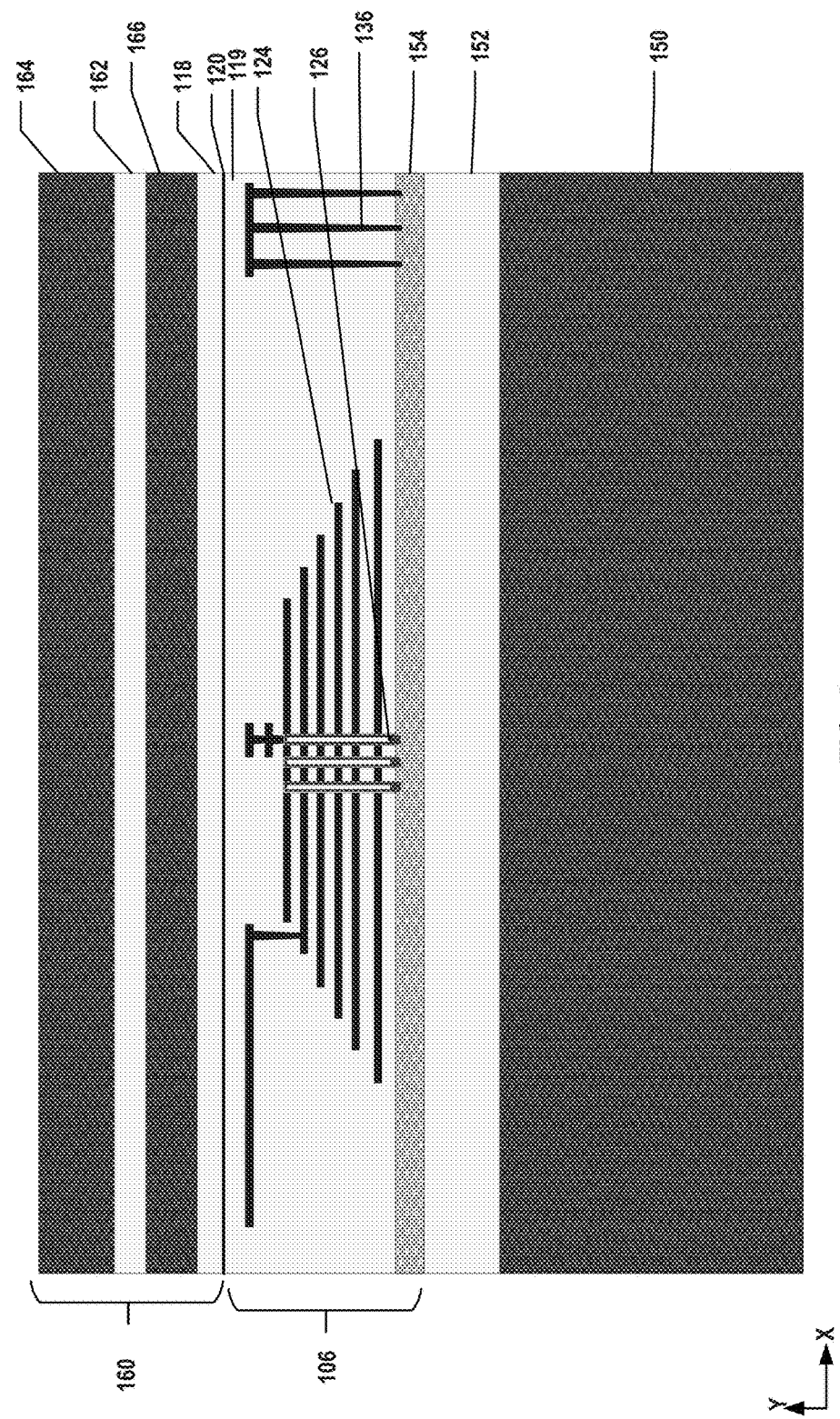
Figure 10:
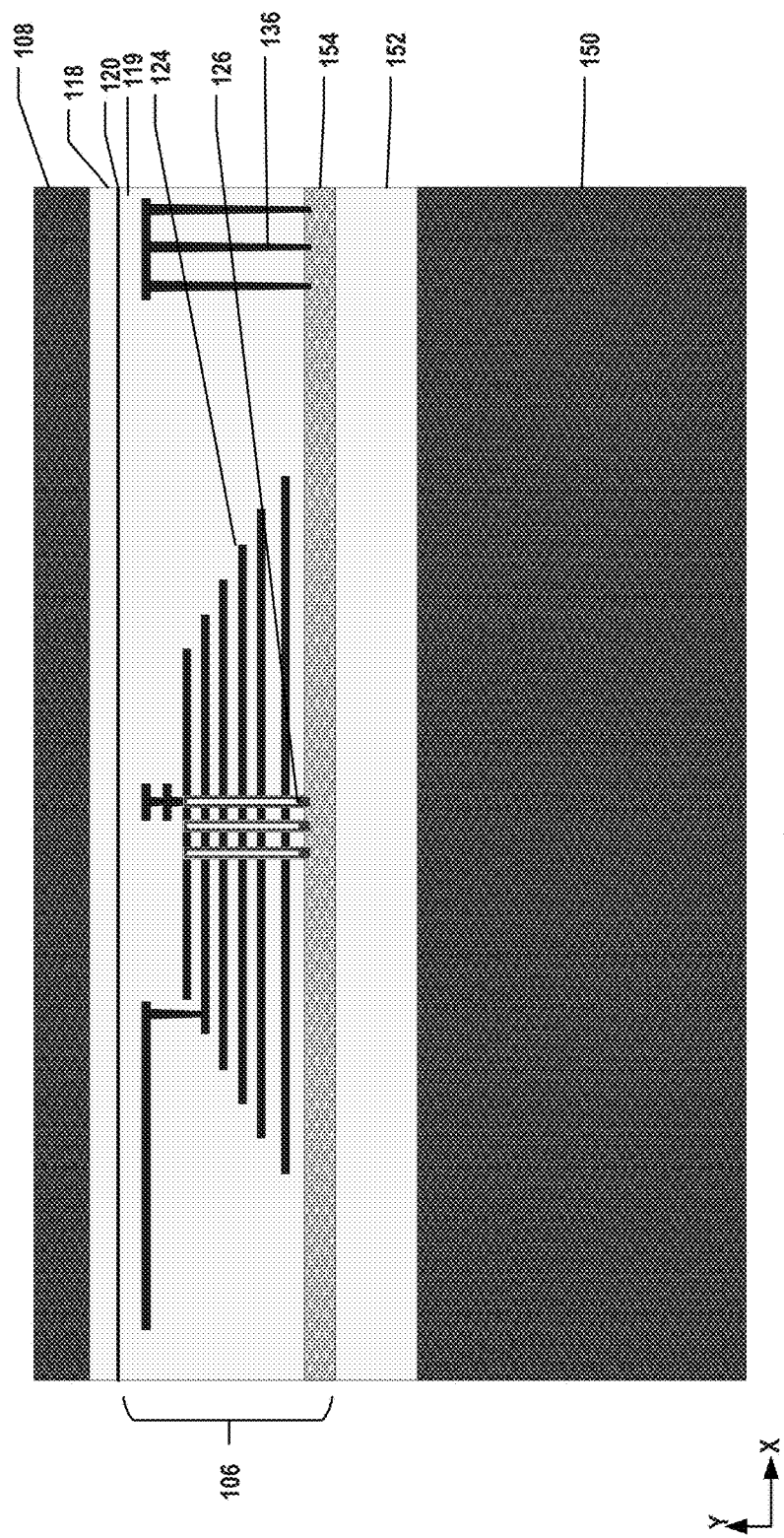
Figure 19:
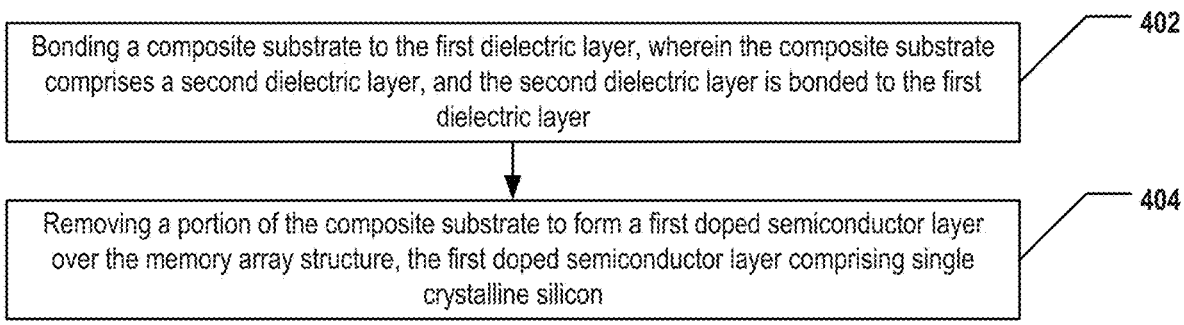
FIG. 19 illustrates a flowchart of a further exemplary method for forming a 3D memory device, according to some aspects of the present disclosure.

In some implementations, bonding substrate 108 on dielectric layer 119 may include another series of operations shown in FIGS. 8-10. In FIGS. 8-10, a single crystalline silicon layer (substrate 108) is transferred from a composite substrate 160 onto dielectric layer 119. FIG. 19 is a flowchart of an exemplary method 400 for transferring a single crystalline silicon layer, according to some aspects of the present disclosure.

As shown in FIG. 8 and operation 402 in FIG. 19, composite substrate 160 is provided, and then composite substrate 160 is bonded on second semiconductor structure 106, as shown in FIG. 9. Composite substrate 160 may include dielectric layer 118, a single crystalline silicon layer 166, an insulation layer 162, and a sacrifice layer 164 on the top. In some implementations, composite substrate 160 may be manufactured independently from a semiconductor substrate as a silicon wafer, e.g., silicon-on-insulator (SOI) wafer. For example, a wafer made of single crystalline silicon may first be provided by cutting from a large cylindrical ingot of silicon. Then high energy ion implantation may be carried out on the wafer so that an oxygen-rich layer may be formed within the wafer, which is subsequently oxidized to form insulation layer 162 (e.g., silicon oxide layer). In some implementations, oxygen is implanted into the single crystalline silicon wafer and converted into a silicon dioxide buried layer (insulation layer 162). Dielectric layer 118 (e.g., silicon oxide layer) may be further formed on single crystalline silicon layer 108. Composite substrate 160 including heterogeneous materials (e.g., single crystalline silicon, silicon oxide, etc.) is thus obtained.

Composite substrate 160 is bonded to second semiconductor structure 106 in a face-to-face manner, in which dielectric layer 118 and dielectric layer 119 are bonded together, and bonding interface 120 is formed on the bonding surface between dielectric layer 118 and dielectric layer 119.

As shown in FIG. 10 and operation 404 in FIG. 19, a portion of composite substrate 160 is removed to form the doped semiconductor layer (substrate 108). In some implementations, a portion of composite substrate 160 that includes sacrifice layer 164 and insulation layer 162 may be subsequently broken and peeled off from the rest of composite substrate 160 in a de-bonding process along a heterogeneous interface that separates the layers of heterogeneous materials, e.g., the interface between insulation layer 162 and single crystalline silicon layer 166. Thus, only single crystalline silicon layer 166 is left on top of dielectric layers 118 and 119. The remainder of single crystalline silicon layer 166 forms substrate 108, and substrate 108 is doped single crystalline silicon, as shown in FIG. 3.

Figure 11:
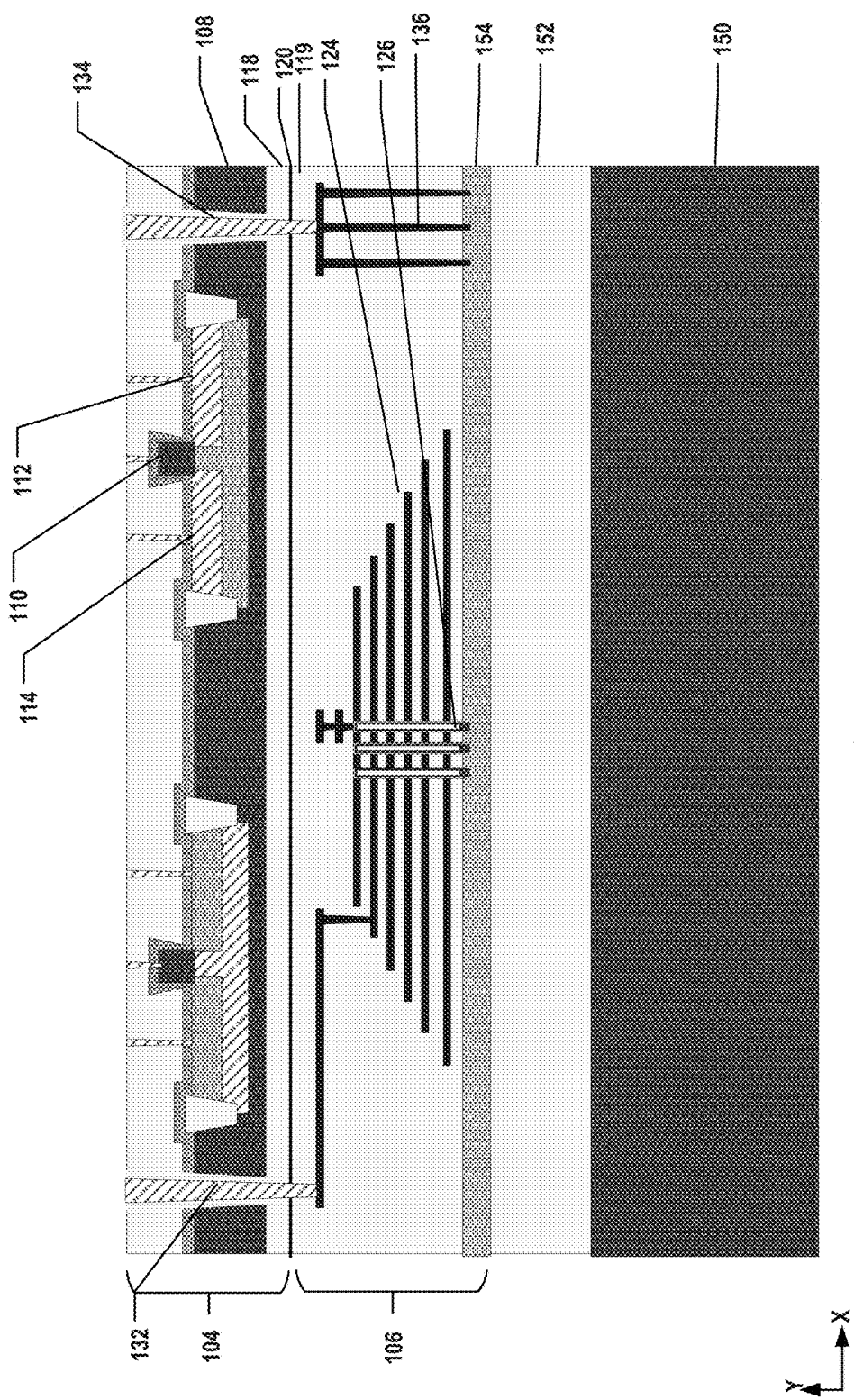

As shown in FIG. 11 and operation 206 in FIG. 17, peripheral device layer 104 is formed in substrate 108. Peripheral device layer 104 may include a plurality of peripheral circuits that are electrically connected to memory array structure (second semiconductor structure 106) through the later formed interconnection layer 116. In some implementations, peripheral device layer 104 may include a plurality of transistors, as shown in FIG. 11. Each transistor may include first source/drain terminal 112, second source/drain terminal 114, and gate terminal 110 formed in substrate 108 as doped regions. In some implementations, isolation regions (e.g., shallow trench isolations (STIs)) are also formed in substrate 108 by wet etching and/or dry etching and thin film deposition. The transistors can form peripheral circuits in peripheral device layer 104. In some implementations, two transistors having different doping types may form a CMOS structure, as shown in FIG. 11.

In some implementations, TSC structures 132 and 134 may also be formed in substrate 108 and penetrate through substrate 108 to second semiconductor structure 106. TSC structures 132 and 134 may provide electrical connection between components of heterogeneous materials, such as combining peripheral circuits with memory cells. In some implementations, TSC structures 132 and 134 may include conductive materials including, but not limited to, tungsten (W), cobalt (Co), copper (Cu), aluminum (Al), silicides, or any combination thereof. TSC structure 134 may contact TAC 136 in second semiconductor structure 106, and TSC structure 132 may contact the word line in second semiconductor structure 106.

Figure 12:
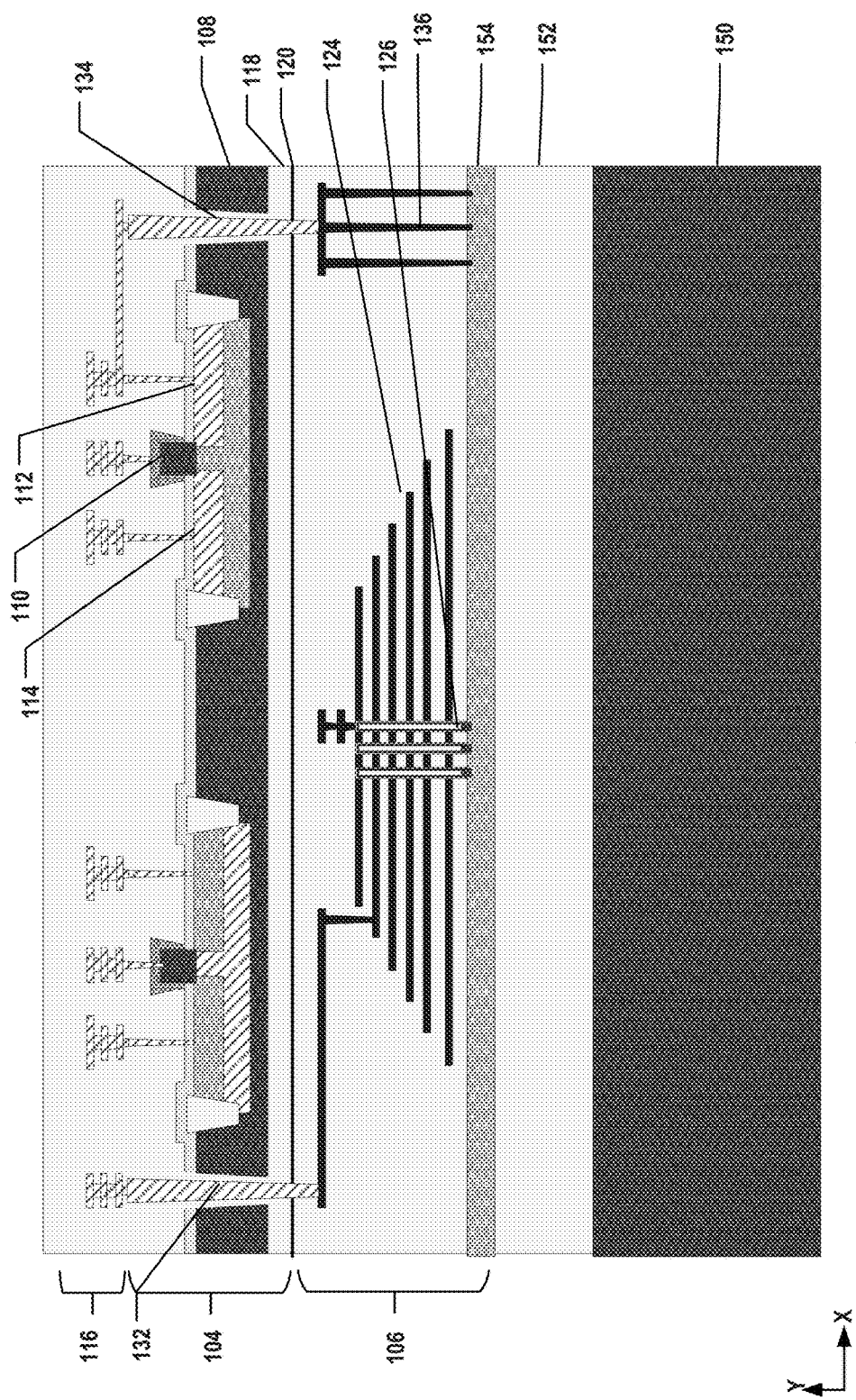

As shown in FIG. 12 and operation 208 in FIG. 17, interconnection layer 116 is formed on peripheral device layer 104. Interconnection layer 116 may be above and electrically connect second source/drain terminal 114 to second semiconductor structure 106 through TSC structure 134 and TAC 136. In some implementations, interconnection layer 116 may further connect a plurality of peripheral devices in 3D memory device 100. In some implementations, interconnection layer 116 may include one or more interlayer dielectric (ILD) layers and one or more redistribution layers disposed in the ILD layers to electrically connect devices. The ILD layers may include dielectric materials including, but not limited to, silicon oxide, silicon nitride, silicon oxynitride, low-k dielectrics, or any combination thereof. The redistribution layer may include conductive materials including, but not limited to W, Co, Cu, Al, silicides, or any combination thereof.

Figure 13:
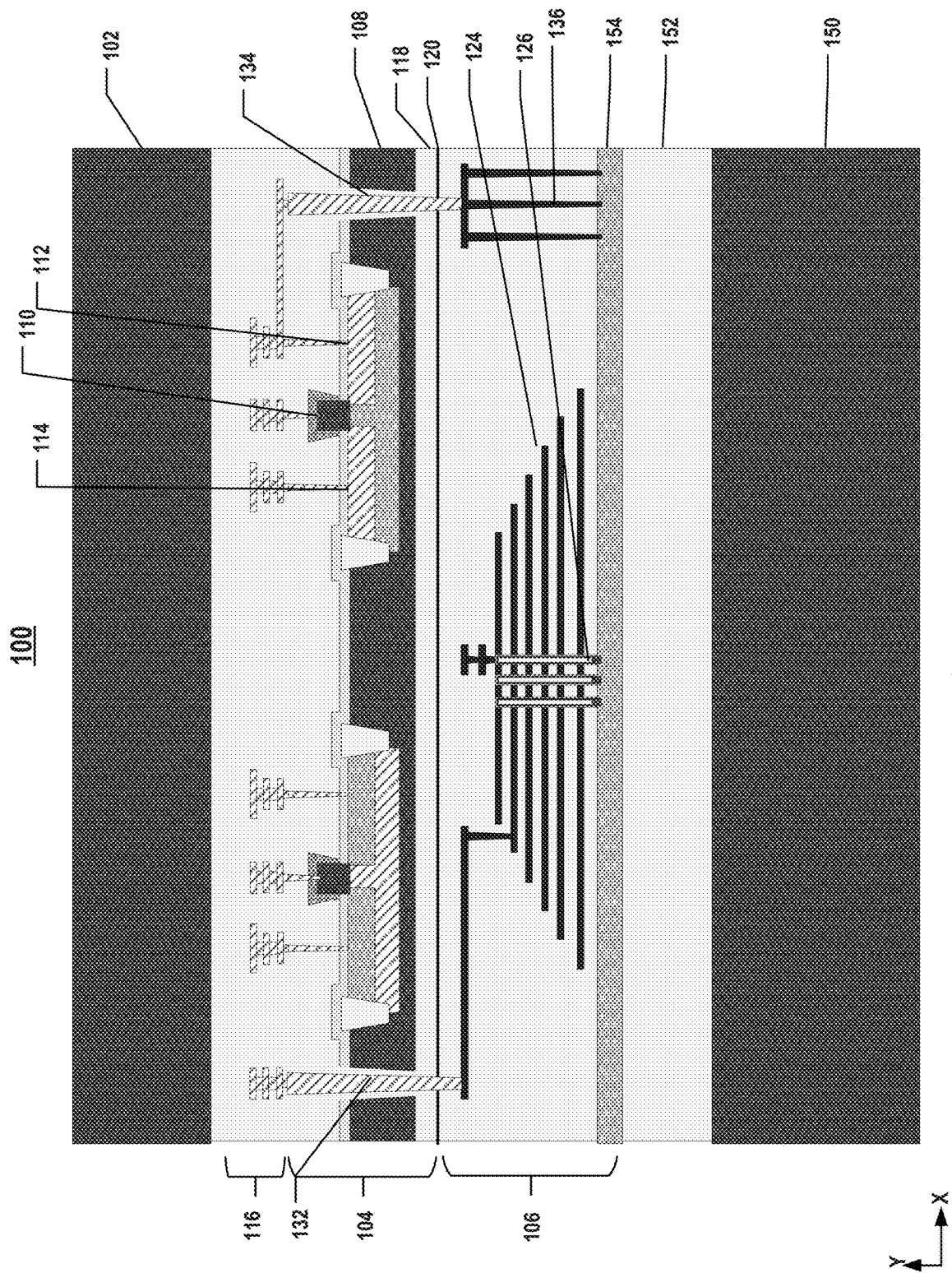

As shown in FIG. 13 and operation 210 in FIG. 17, substrate 102 is formed on interconnection layer 116. Substrate 102 may be a doped semiconductor layer and may include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 102 may be silicon or glass handle wafer, or other suitable materials that can hold die, components, transistors, or other devices.

Figure 14:
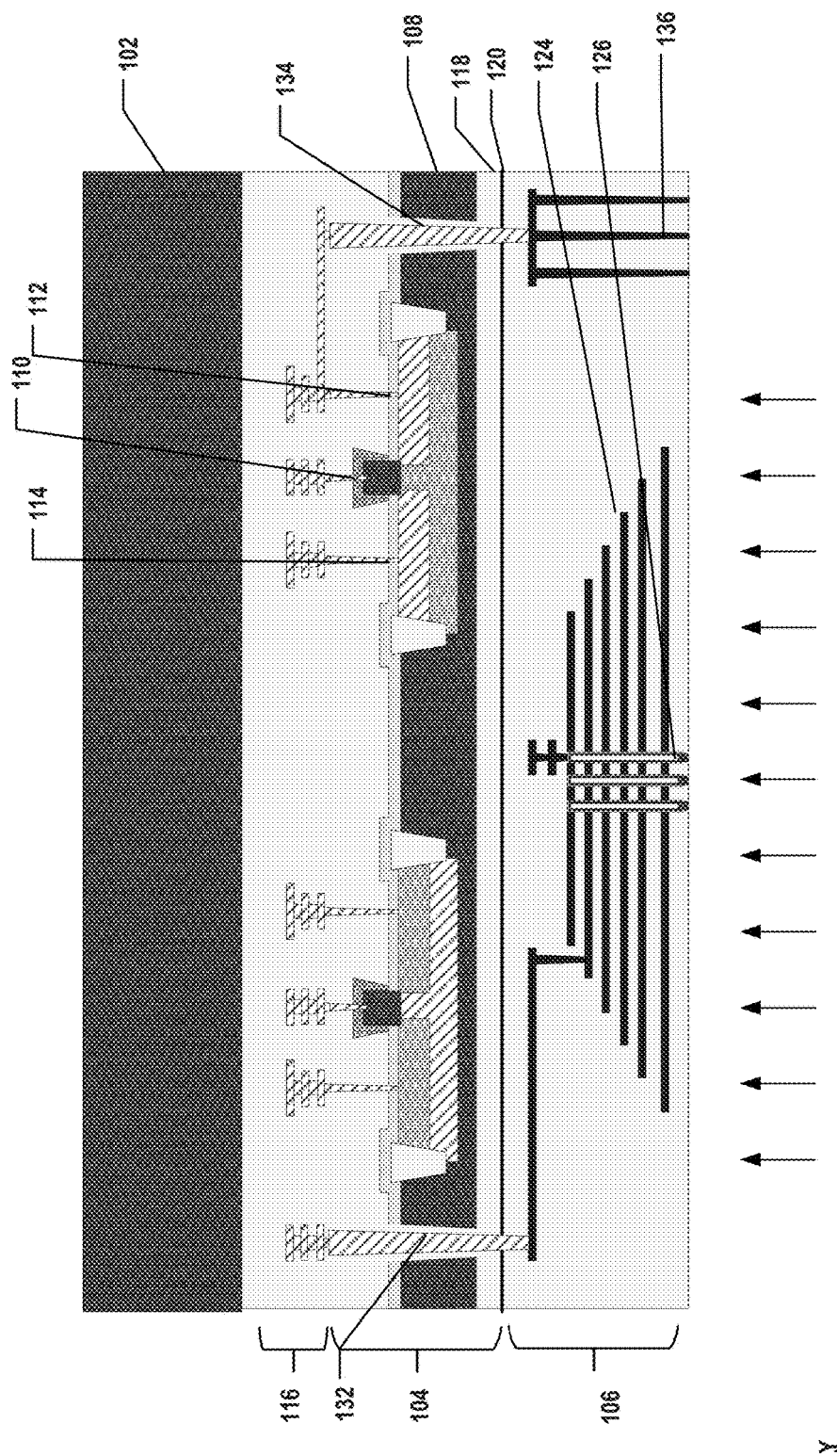

Then, as shown in FIG. 14 and operation 212 in FIG. 17, carrier substrate 150, first stop layer 152, and second stop layer 154 are removed to expose the memory array structure. In some implementations, carrier substrate 150 is removed from the backside until being stopped by first stop layer 152 (e.g., a silicon nitride or silicon oxide layer). Carrier substrate 150 can be completely removed using CMP, grinding, dry etching, and/or wet etching. In some implementations, carrier substrate 150 is peeled off. In some implementations in which carrier substrate 150 includes silicon and first stop layer 152 includes silicon oxide, carrier substrate 150 is removed using silicon CMP, which can be automatically stopped when reaching first stop layer 152 having materials other than silicon, i.e., acting as a backside CMP stop layer. In some implementations, carrier substrate 150 (a silicon substrate) is removed using wet etching by tetramethylammonium hydroxide (TMAH), which is automatically stopped when reaching first stop layer 152 having materials other than silicon, i.e., acting as a backside etch stop layer. First stop layer 152 can ensure the complete removal of carrier substrate 150 without the concern of thickness uniformity after thinning.

In some implementations, first stop layer 152 may be removed using wet etching with suitable etchants, such as phosphoric acid and hydrofluoric acid, until being stopped by second stop layer 154 having a different material (e.g., silicon nitride) from first stop layer 152. In some implementations, second stop layer 154 is removed after removing first stop layer 152 using wet etching by phosphoric acid.

Figure 15:
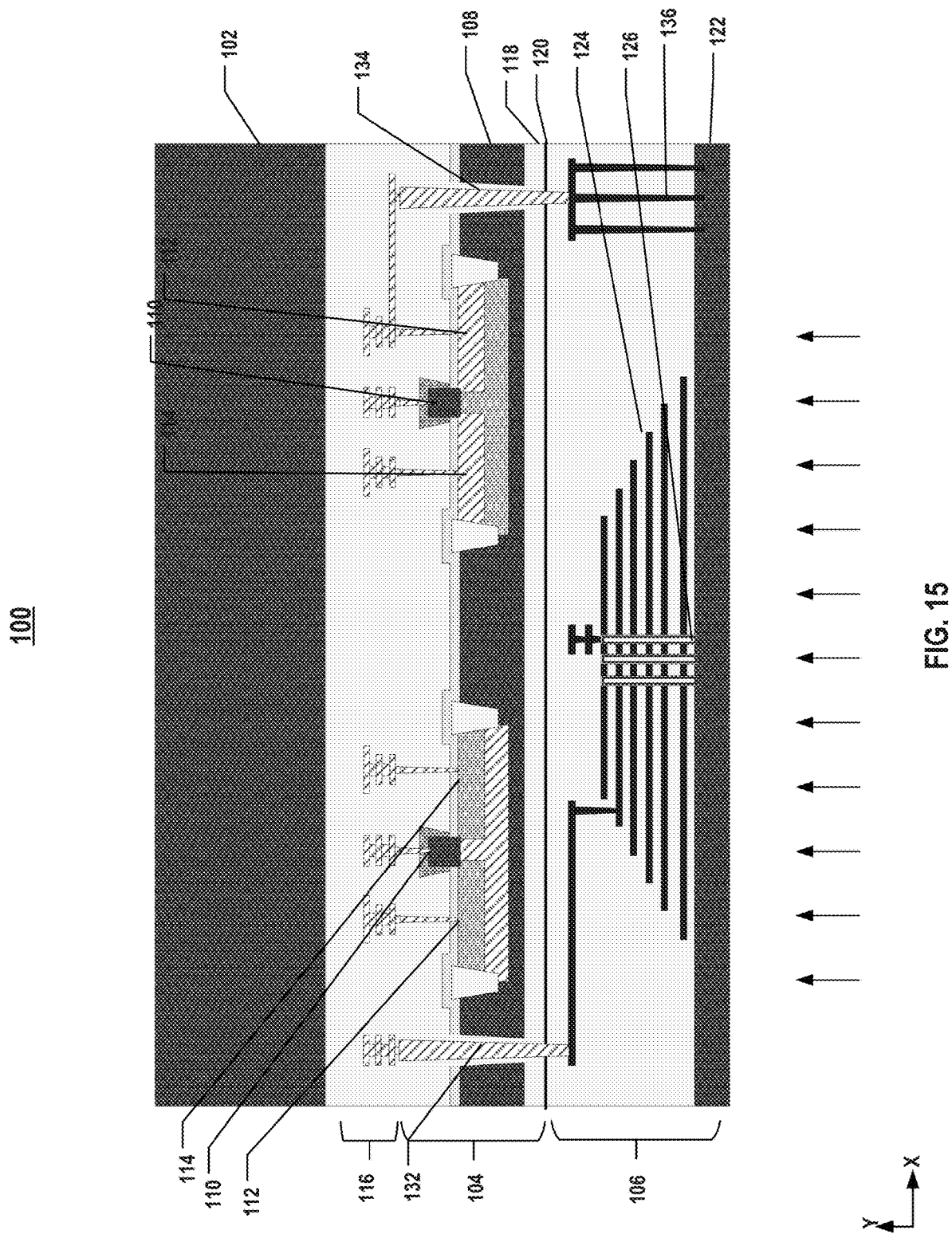

As shown in FIG. 15 and operation 214 in FIG. 17, substrate 122 is formed over the exposed memory array structure. Substrate 122 is in contact with the exposed part of the semiconductor channel. In some implementations, to form substrate 122, a semiconductor layer (e.g., polysilicon) is deposited on the exposed memory array structure using one or more thin film deposition processes, such as ALD, CVD, PVD, any other suitable processes, or any combination thereof. The deposited semiconductor layer can be doped with N-type dopant(s), such as P, As, or Sb, using ion implantation and/or thermal diffusion.

In some implementations, substrate 122 and the part of the semiconductor channel in contact with substrate 122 are locally activated. In some implementations, to locally activate, heat is applied in a confined area having the doped semiconductor layer (substrate 122) and the part of semiconductor channel to activate dopants in the doped semiconductor layer and the part of the semiconductor channel. The confined area can be between the stack structure and the doped semiconductor layer. In some implementations, the doping concentration of the doped semiconductor layer and the doping concentration of the part of the semiconductor channel in contact with the doped semiconductor layer each is between $10^{19}$ cm$^{-3}$ and $10^{21}$ cm$^{-3}$ after the activation.

In some implementations, heat is applied in a confined area having the doped semiconductor layer and the part of the semiconductor channel to activate the dopant(s) therein, such as N-type dopants (e.g., P, As, or Sb). The heat can be applied and focused by any suitable techniques, such as annealing, laser, ultrasound, or any other suitable thermal processes. The local activation process can activate the dopants doped into substrate 122 and the part of the semiconductor channel.

Figure 16:
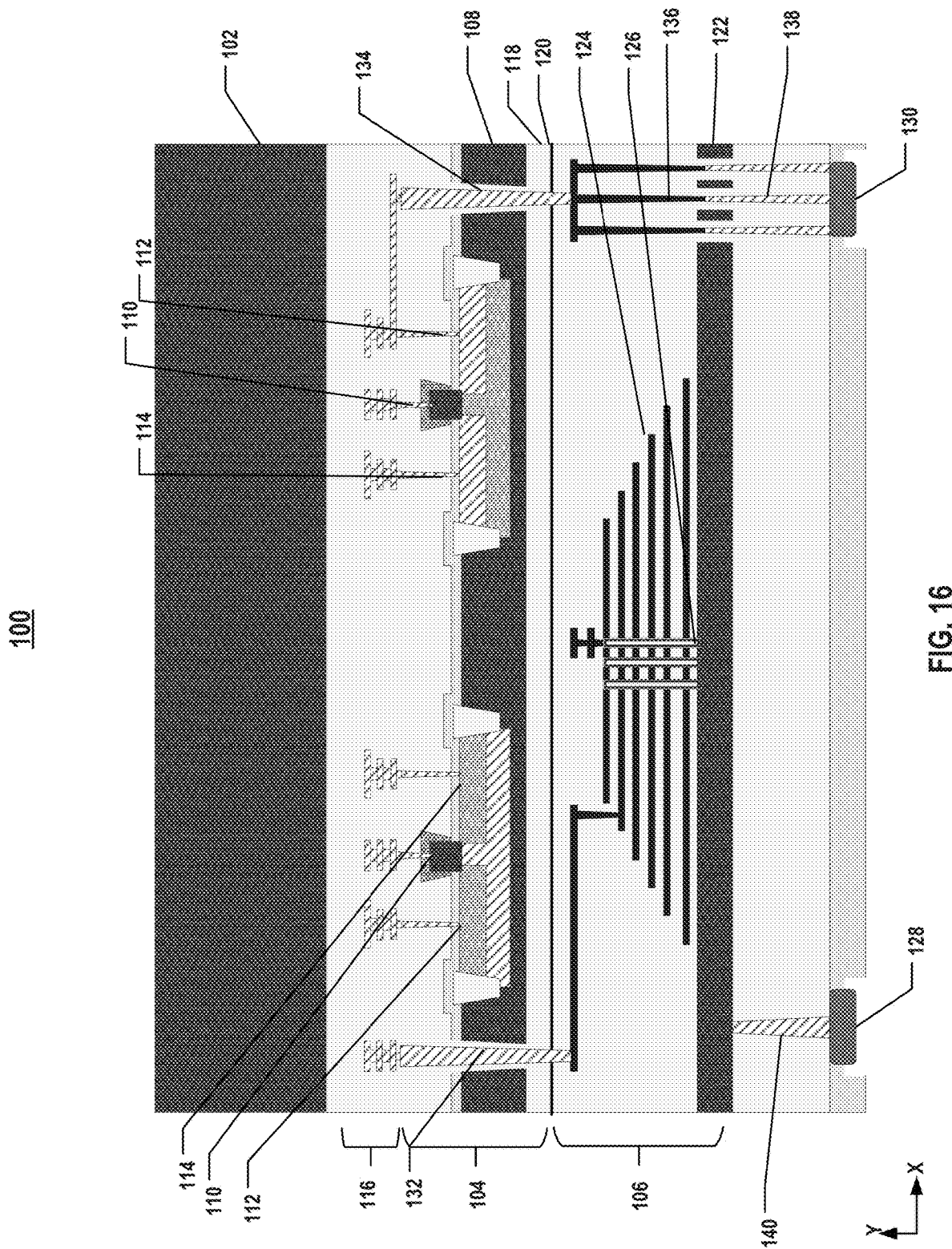
Figure 17:
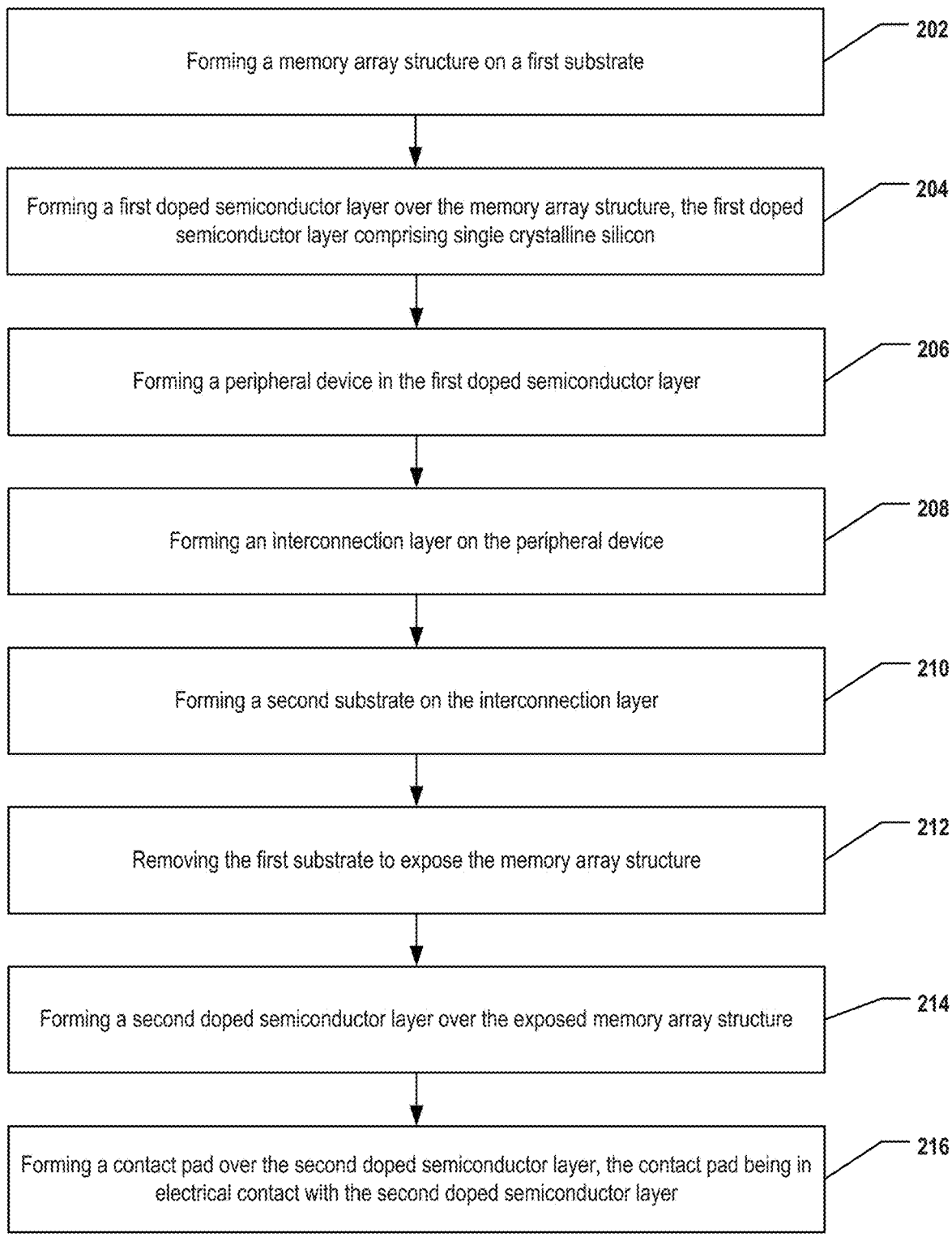
FIG. 17 illustrates a flowchart of an exemplary method for forming a 3D memory device, according to some aspects of the present disclosure.

As shown in FIG. 16 and operation 216 in FIG. 17, contact pads 128 and 130 are formed beneath second semiconductor structure 106. Contact pad 128 is in electrical contact with the array common source (ACS) (substrate 122) through VIA structure 140. Contact pad 130 is in electrical contact with first source/drain terminal 112 through interconnection layer 116, TSC structure 134, TAC 136, and VIA structure 138.

Memory array structure (second semiconductor structure 106) is formed between contact pads 128/130 and peripheral device layer 104, including one or more peripheral devices. In other words, 3D memory device 100 is in a "core under periphery" (CUP) architecture, and the structure is padded out from the bottom side of the memory array structure. In addition, the active layer of the peripheral devices, e.g., substrate 108 of peripheral device layer 104, is bonded to second semiconductor structure 106 through the transfer bonding methods 300 or 400, and peripheral devices can be electrically connected to the memory array structure through TSC structures 132 or 134. Because peripheral device layer 104 is bonded onto the memory array structure after finishing the manufacturing process of the memory array structure, the peripheral devices in peripheral device layer 104 can avoid being treated under a high temperature generally used in the manufacturing process of the memory array structure. Therefore, the liability of the peripheral devices can be improved, and the conductive material used in the peripheral devices can have more options as well. For example, since the peripheral devices will not be treated in the high temperature, the conductive lines or layers in peripheral device layer 104 or interconnection layer 116 can be formed by Cu to improve the liability and performance of 3D memory device 100.

Figure 20:
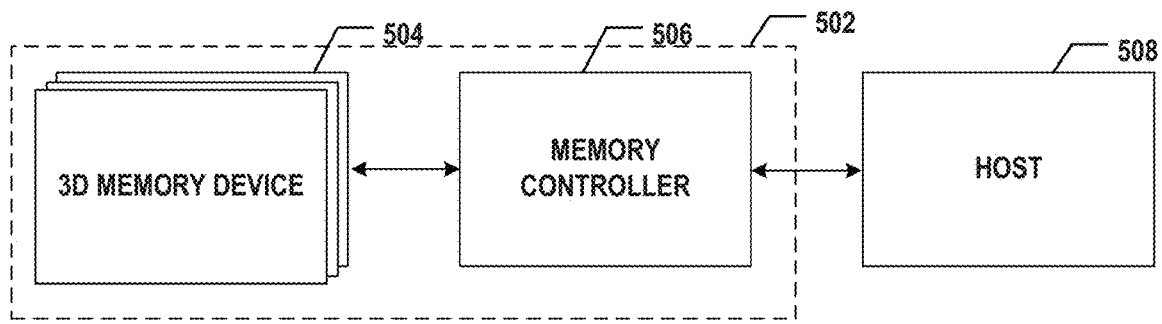
FIG. 20 illustrates a block diagram of an exemplary system having a memory device, according to some aspects of the present disclosure.

FIG. 20 illustrates a block diagram of an exemplary system 500 having a memory device, according to some aspects of the present disclosure. System 500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 20, system 500 can include a host 508 and a memory system 502 having one or more memory devices 504 and a memory controller 506. Host 508 can be a processor of an electronic device, such as a central processing unit (CPU), or a system-on-chip (SoC), such as an application processor (AP). Host 508 can be configured to send or receive data to or from memory devices 504.

Memory device 504 can be any memory device disclosed in the present disclosure. As disclosed above in detail, memory device 504, such as a NAND Flash memory device, may have a controlled and predefined discharge current in the discharge operation of discharging the bit lines. Memory controller 506 is coupled to memory device 504 and host 508 and is configured to control memory device 504, according to some implementations. Memory controller 506 can manage the data stored in memory device 504 and communicate with host 508. For example, memory controller 506 may be coupled to memory device 504, such as 3D memory device 100 described above, and memory controller 506 may be configured to control operations of memory array structure 106 through peripheral device layer 104, interconnection layer 116 and contact pad 128. By forming the structure according to the present disclosure, the signals of 3D memory device 100 can be padded out from the upper side of the peripheral devices. In addition, the liability of the peripheral devices can be improved, and the conductive material used in the peripheral devices can have more options as well.

In some implementations, memory controller 506 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 506 is designed for operating in a high duty-cycle environment SSDs or embedded multi-media-cards (eMMCs) used as data storage for mobile devices, such as smartphones, tablets, laptop computers, etc., and enterprise storage arrays. Memory controller 506 can be configured to control operations of memory device 504, such as read, erase, and program operations. Memory controller 506 can also be configured to manage various functions with respect to the data stored or to be stored in memory device 504 including, but not limited to bad-block management, garbage collection, logical-to-physical address conversion, wear leveling, etc. In some implementations, memory controller 506 is further configured to process error correction codes (ECCs) with respect to the data read from or written to memory device 504. Any other suitable functions may be performed by memory controller 506 as well, for example, formatting memory device 504. Memory controller 506 can communicate with an external device (e.g., host 508) according to a particular communication protocol. For example, memory controller 506 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 21A:
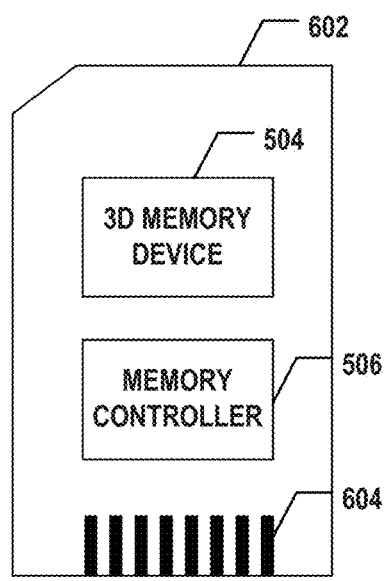
FIG. 21A illustrates a diagram of an exemplary memory card having a memory device, according to some aspects of the present disclosure.
Figure 21B:
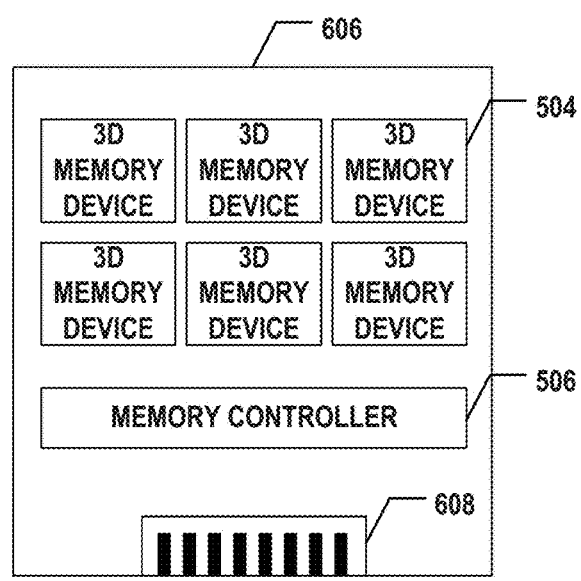
FIG. 21B illustrates a diagram of an exemplary solid-state drive (SSD) having a memory device, according to some aspects of the present disclosure.

Memory controller 506 and one or more memory devices 504 can be integrated into various types of storage devices, for example, be included in the same package, such as a universal Flash storage (UFS) package or an eMMC package. That is, memory system 502 can be implemented and packaged into different types of end electronic products. In one example as shown in FIG. 21A, memory controller 506 and a single memory device 504 may be integrated into a memory card 602. Memory card 602 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 602 can further include a memory card connector 604 coupling memory card 602 with a host (e.g., host 508 in FIG. 20). In another example as shown in FIG. 21B, memory controller 506 and multiple memory devices 504 may be integrated into an SSD 606. SSD 606 can further include an SSD connector 608 coupling SSD 606 with a host (e.g., host 508 in FIG. 20). In some implementations, the storage capacity and/or the operation speed of SSD 606 is greater than those of memory card 602.

According to one aspect of the present disclosure, a 3D memory device is disclosed. The 3D memory device includes a first substrate, a first semiconductor structure, and a second semiconductor structure. The first semiconductor structure is disposed on the first substrate. The first semiconductor structure includes a second substrate, and a peripheral device disposed over the second substrate, and the peripheral device is formed facing the first substrate. The second semiconductor structure is disposed on the first semiconductor structure. The second semiconductor structure includes a doped semiconductor layer, and a memory array structure disposed between the doped semiconductor layer and the first semiconductor structure.

In some implementations, the 3D memory device further includes an interconnection layer. The second semiconductor structure is disposed between the interconnection layer and the first semiconductor structure, and a first contact pad is formed in the interconnection layer electrically coupled to the doped semiconductor layer of the second semiconductor structure. In some implementations, the 3D memory device further includes a bonding interface between the first semiconductor structure and the second semiconductor structure. In some implementations, the second substrate includes a single crystalline silicon layer disposed between the first substrate and the doped semiconductor layer.

In some implementations, the memory array structure further includes a memory stack having a plurality of interleaved conductive layers and dielectric layers, and a channel structure extending through the memory stack. The channel structure includes a memory film and a semiconductor channel. The semiconductor channel is in contact with the doped semiconductor layer.

In some implementations, the 3D memory device further includes a first through silicon contact structure disposed between the first semiconductor structure and the second semiconductor structure. At least one of the conductive layers is electrically coupled to the peripheral device through the first through silicon contact structure. In some implementations, the 3D memory device further includes a second through silicon contact structure disposed between the first semiconductor structure and the second semiconductor structure, and a through array connecting line extending through the second semiconductor structure. The peripheral device is electrically coupled to a second contact pad in the interconnection layer through the second through silicon contact structure and the through array connecting line.

In some implementations, the peripheral device further includes a transistor, and the second contact pad is electrically coupled to a first source/drain terminal of the transistor through the second through silicon contact structure and the through array connecting line.

According to another aspect of the present disclosure, a system is disclosed. The system includes a 3D memory device configured to store data and a memory controller. The 3D memory device includes a first substrate, a first semiconductor structure, and a second semiconductor structure. The first semiconductor structure is disposed on the first substrate. The first semiconductor structure includes a second substrate, and a peripheral device disposed over the second substrate, and the peripheral device is formed facing the first substrate. The second semiconductor structure is disposed on the first semiconductor structure. The second semiconductor structure includes a doped semiconductor layer, and a memory array structure disposed between the doped semiconductor layer and the first semiconductor structure. The memory controller is coupled to the 3D memory device and is configured to control operations of the 3D memory device.

According to still another aspect of the present disclosure, a method for forming a 3D memory device is disclosed. A memory array structure is formed. A first substrate is formed over the memory array structure. A peripheral device is formed in contact with the first substrate. A first interconnection layer is formed in a first dielectric layer over the peripheral device. A second substrate is formed over the first dielectric layer. A doped semiconductor layer is formed in contact with the memory array structure.

In some implementations, a second interconnection layer is formed over the doped semiconductor layer. A first contact pad of the second interconnection layer is electrically coupled to the doped semiconductor layer. In some implementations, a dielectric stack including a plurality of dielectric layers and a plurality of sacrificial layers is formed interleaved with the plurality of dielectric layers. A channel structure is formed extending vertically through the dielectric stack. The plurality of sacrificial layers are replaced with a plurality of conductive layers.

In some implementations, a stack structure including a plurality of word lines is formed. A channel structure is formed extending vertically through the stack structure.

In some implementations, a third substrate including a second dielectric layer is provided. The third substrate is bonded to the memory array structure in a face-to-face manner through the second dielectric layer. A heterogeneous interface is formed in the third substrate. A portion of the third substrate is removed along the heterogeneous interface to form the first substrate. In some implementations, forming the heterogeneous interface in the third substrate includes implanting a dopant into the third substrate. In some implementations, the dopant includes hydrogen.

In some implementations, a composite substrate is bonded on the memory array structure. A portion of the composite substrate is removed to form the first substrate. In some implementations, the composite substrate includes a silicon-on-insulator (SOI) substrate including a single crystalline silicon layer, an insulation layer, and a single crystalline silicon substrate. In some implementations, the single crystalline silicon substrate and the insulation layer above the single crystalline silicon layer are removed from the composite substrate to form the first substrate.

In some implementations, a transistor is formed in the first substrate. The transistor includes a gate structure, a first source/drain terminal, and a second source/drain terminal. In some implementations, a first through silicon contact structure is formed penetrating the first substrate. The memory array structure is electrically coupled to the peripheral device through the first through silicon contact structure. In some implementations, the first through silicon contact structure is electrically connected with the peripheral device.

In some implementations, a second through silicon contact structure is formed penetrating the first substrate. A through array connecting line is formed extending through the memory array structure. The first source/drain terminal of the peripheral device is electrically coupled to a second contact pad in the second interconnection layer through the second through silicon contact structure and the through array connecting line. In some implementations, a part of the memory array structure is removed to expose a part of a channel structure.

In some implementations, the doped semiconductor layer is formed in contact with the exposed part of the channel structure. The doped semiconductor layer and the part of the channel structure in contact with the doped semiconductor layer are locally activated. In some implementations, heat is applied in an area having the doped semiconductor layer and the part of the channel structure to activate dopants in the doped semiconductor layer and the part of the channel structure. In some implementations, an implantation operation is performed on the exposed memory array structure.

According to yet another aspect of the present disclosure, a method for forming a 3D memory device is disclosed. A first dielectric layer is formed on a first substrate. A memory array structure is formed in the first dielectric layer. A second substrate is bonded to the first dielectric layer, the second substrate includes a second dielectric layer, and the second dielectric layer is bonded to the first dielectric layer. A heterogeneous interface is formed in the second substrate. A portion of the second substrate is removed along the heterogeneous interface to form a third substrate over the memory array structure. A peripheral device is formed in contact with the third substrate. A first interconnection layer is formed over the peripheral device and the third substrate. The first substrate is removed to expose the memory array structure. A doped semiconductor layer is formed in contact with the memory array structure.

In some implementations, a second interconnection layer is formed over the doped semiconductor layer. A first contact pad of the second interconnection layer is electrically coupled to the doped semiconductor layer. In some implementations, a dielectric stack including a plurality of dielectric layers and a plurality of sacrificial layers is formed interleaved on the first substrate. A channel structure is formed extending vertically through the dielectric stack in contact with the first substrate. The plurality of sacrificial layers are replaced with a plurality of conductive layers.

In some implementations, a stack structure including a plurality of word lines is formed on the first substrate. A channel structure is formed extending vertically through the stack structure in contact with the first substrate.

In some implementations, forming the heterogeneous interface in the third substrate includes implanting a dopant into the third substrate. In some implementations, the dopant includes hydrogen.

In some implementations, a transistor is formed in the third substrate. The transistor includes a gate structure, a first source/drain terminal, and a second source/drain terminal. In some implementations, a first through silicon contact structure is formed penetrating the third substrate. The memory array structure is electrically coupled to the peripheral device through the first through silicon contact structure. In some implementations, the first through silicon contact structure is electrically connected with the peripheral device.

In some implementations, a second through silicon contact structure is formed penetrating the third substrate. A through array connecting line is formed extending through the memory array structure. The first source/drain terminal of the peripheral device is electrically coupled to a second contact pad in the second interconnection layer through the second through silicon contact structure and the through array connecting line. In some implementations, the first substrate and a part of the memory array structure are sequentially removed to expose a part of a channel structure.

In some implementations, the second doped semiconductor layer is formed in contact with the exposed part of the channel structure. The doped semiconductor layer and the part of the channel structure in contact with the doped semiconductor layer are locally activated. In some implementations, heat is applied in an area having the doped semiconductor layer and the part of the channel structure to activate dopants in the doped semiconductor layer and the part of the channel structure. In some implementations, an implantation operation is performed on the exposed memory array structure.

According to yet another aspect of the present disclosure, a method for forming a 3D memory device is disclosed. A first dielectric layer is formed on a first substrate. A memory array structure is formed in the first dielectric layer. A composite substrate is bonded to the first dielectric layer, the composite substrate includes a second dielectric layer, and the second dielectric layer is bonded to the first dielectric layer. A portion of the composite substrate is removed to form a second substrate over the memory array structure. A peripheral device is formed in contact with the second substrate. A first interconnection layer is formed over the peripheral device and the second substrate. The first substrate is removed to expose the memory array structure. A doped semiconductor layer is formed in contact with the memory array structure.

In some implementations, a second interconnection layer is formed over the doped semiconductor layer. A first contact pad of the second interconnection layer is electrically coupled to the doped semiconductor layer. In some implementations, a dielectric stack including a plurality of dielectric layers and a plurality of sacrificial layers is formed interleaved on the first substrate. A channel structure is formed extending vertically through the dielectric stack in contact with the first substrate. The plurality of sacrificial layers are replaced with a plurality of conductive layers.

In some implementations, a stack structure including a plurality of word lines is formed on the first substrate. A channel structure is formed extending vertically through the stack structure in contact with the first substrate.

In some implementations, the composite substrate includes a silicon-on-insulator (SOI) substrate including a single crystalline silicon layer, an insulation layer, and a single crystalline silicon substrate. In some implementations, the single crystalline silicon substrate and the insulation layer above the single crystalline silicon layer are removed from the composite substrate to form the second substrate.

In some implementations, a transistor is formed in the second substrate. The transistor includes a gate structure, a first source/drain terminal, and a second source/drain terminal. In some implementations, a first through silicon contact structure is formed penetrating the second substrate. The memory array structure is electrically coupled to the peripheral device through the first through silicon contact structure. In some implementations, the first through silicon contact structure is electrically connected with the peripheral device.

In some implementations, a second through silicon contact structure is formed penetrating the second substrate. A through array connecting line is formed extending through the memory array structure. The first source/drain terminal of the peripheral device is electrically coupled to a second contact pad in the second interconnection layer through the second through silicon contact structure and the through array connecting line. In some implementations, the first substrate and a part of the memory array structure are sequentially removed to expose a part of a channel structure.

In some implementations, the doped semiconductor layer is formed in contact with the exposed part of the channel structure. The doped semiconductor layer and the part of the channel structure in contact with the doped semiconductor layer are locally activated. In some implementations, heat is applied in an area having the doped semiconductor layer and the part of the channel structure to activate dopants in the doped semiconductor layer and the part of the channel structure. In some implementations, an implantation operation is performed on the exposed memory array structure.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
   a first semiconductor structure comprising a peripheral device;
   a second semiconductor structure disposed on the first semiconductor structure, the second semiconductor structure comprising a doped semiconductor layer, and a memory array structure disposed between the doped semiconductor layer and the first semiconductor structure, the peripheral device in the first semiconductor structure facing opposite to the second semiconductor structure; and
   a contact structure, wherein the second semiconductor structure is disposed between the contact structure and the first semiconductor structure, the doped semiconductor layer is disposed between the contact structure and the memory array structure, and a first contact pad is formed on the contact structure electrically coupled to the doped semiconductor layer of the second semiconductor structure.

2. The 3D memory device of claim 1, further comprising a bonding interface between the first semiconductor structure and the second semiconductor structure.

3. The 3D memory device of claim 1, wherein the first semiconductor structure is disposed on a first substrate and the first semiconductor structure comprises a second substrate, the peripheral device is disposed over the second substrate, and the second substrate comprises a single crystalline silicon layer disposed between the first substrate and the doped semiconductor layer.

4. The 3D memory device of claim 1, wherein the memory array structure further comprises:
   a memory stack having a plurality of interleaved conductive layers and dielectric layers; and
   a channel structure extending through the memory stack, the channel structure comprising a memory film and a semiconductor channel,
   wherein the semiconductor channel is in contact with the doped semiconductor layer.

5. The 3D memory device of claim 4, further comprising:
   a first through silicon contact structure disposed between the first semiconductor structure and the second semiconductor structure,
   wherein at least one of the interleaved conductive layers is electrically coupled to the peripheral device through the first through silicon contact structure.

6. The 3D memory device of claim 5, further comprising:
   a second through silicon contact structure disposed between the first semiconductor structure and the second semiconductor structure; and
   a through array connecting line extending through the second semiconductor structure,
   wherein the peripheral device is electrically coupled to a second contact pad through the second through silicon contact structure and the through array connecting line.

7. The 3D memory device of claim 6, wherein the peripheral device further comprises a transistor, and the second contact pad is electrically coupled to a first source/drain terminal of the transistor through the second through silicon contact structure and the through array connecting line.

8. A method for forming a three-dimensional (3D) memory device, comprising:
   forming a memory array structure;
   forming a first substrate over the memory array structure;
   forming a peripheral device in contact with the first substrate;
   forming a first interconnection layer in a first dielectric layer over the peripheral device;
   after forming the first interconnection layer, forming a second substrate over the first dielectric layer; and
   forming a doped semiconductor layer in contact with the memory array structure.

9. The method of claim 8, further comprising:
   forming a second interconnection layer over the doped semiconductor layer,
   wherein a first contact pad of the second interconnection layer is electrically coupled to the doped semiconductor layer.

10. The method of claim 8, wherein forming the memory array structure, further comprises:
   forming a stack structure comprising a plurality of word lines; and
   forming a channel structure extending vertically through the stack structure.

11. The method of claim 8, wherein forming the first substrate over the memory array structure, further comprises:
   providing a third substrate comprising a second dielectric layer;
   bonding the third substrate to the memory array structure in a face-to-face manner through the second dielectric layer;
   forming a heterogeneous interface in the third substrate; and
   removing a portion of the third substrate along the heterogeneous interface to form the first substrate.

12. The method of claim 8, wherein forming the first substrate over the memory array structure, further comprises:
   bonding a composite substrate on the memory array structure; and
   removing a portion of the composite substrate to form the first substrate.

13. The method of claim 8, wherein forming the doped semiconductor layer in contact with the memory array structure, further comprising:
   removing a part of the memory array structure to expose a part of a channel structure;
   forming the doped semiconductor layer in contact with the exposed part of the channel structure; and
   locally activating the doped semiconductor layer and the part of the channel structure in contact with the doped semiconductor layer.

14. A method for forming a three-dimensional (3D) memory device, comprising:
   forming a first dielectric layer on a first substrate;
   forming a memory array structure in the first dielectric layer;
   bonding a second substrate to the first dielectric layer, wherein the second substrate comprises a second dielectric layer, and the second dielectric layer is bonded to the first dielectric layer;
   forming a heterogeneous interface in the second substrate;
   removing a portion of the second substrate along the heterogeneous interface to form a third substrate over the memory array structure;
   forming a peripheral device in contact with the third substrate;
   forming a first interconnection layer over the peripheral device and the third substrate;
   removing the first substrate to expose the memory array structure; and
   forming a doped semiconductor layer in contact with the memory array structure.

15. The method of claim 14, further comprising:
   forming a second interconnection layer over the doped semiconductor layer,
   wherein a first contact pad of the second interconnection layer is electrically coupled to the doped semiconductor layer.

16. The method of claim 14, wherein forming the memory array structure in the first dielectric layer, further comprises:
   forming a stack structure comprising a plurality of word lines on the first substrate; and
   forming a channel structure extending vertically through the stack structure in contact with the first substrate.

17. The method of claim 14, wherein forming the heterogeneous interface in the second substrate comprises implanting a dopant into the second substrate.

18. The method of claim 14, wherein forming the peripheral device in contact with the third substrate, further comprises:
   forming a transistor in the third substrate, the transistor comprising a gate structure, a first source/drain terminal, and a second source/drain terminal.

19. The method of claim 14, wherein removing the first substrate to expose the memory array structure, further comprising:
   sequentially removing the first substrate and a part of the memory array structure to expose a part of a channel structure.

* * * * *